US012272308B2

(12) United States Patent
Gao et al.

(10) Patent No.: US 12,272,308 B2
(45) Date of Patent: Apr. 8, 2025

(54) DISPLAY SUBSTRATE AND DISPLAY DEVICE

(71) Applicant: BOE TECHNOLOGY GROUP CO., LTD., Beijing (CN)

(72) Inventors: Xueling Gao, Beijing (CN); Kuanjun Peng, Beijing (CN); Chengchung Yang, Beijing (CN); Xiangxiang Zou, Beijing (CN); Wei Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/421,268

(22) Filed: Jan. 24, 2024

(65) Prior Publication Data

US 2024/0169917 A1 May 23, 2024

Related U.S. Application Data

(63) Continuation of application No. 18/194,348, filed on Mar. 31, 2023, now Pat. No. 11,922,879, which is a
(Continued)

(30) Foreign Application Priority Data

Sep. 30, 2017 (CN) .......................... 201710917398.9

(51) Int. Cl.
*G09G 3/3233* (2016.01)
*H10K 59/121* (2023.01)

(52) U.S. Cl.
CPC ......... *G09G 3/3233* (2013.01); *H10K 59/121* (2023.02); *G09G 2300/0426* (2013.01);
(Continued)

(58) Field of Classification Search
CPC ........... H10K 59/00–95; H10K 59/131; H10K 59/121
See application file for complete search history.

(56) References Cited

U.S. PATENT DOCUMENTS 8,692,821 B2   4/2014 Park
8,803,770 B2   8/2014 Jeong et al.
(Continued)

FOREIGN PATENT DOCUMENTS

CN    1873509 A    12/2006
CN    101882416 A    11/2010
(Continued)

OTHER PUBLICATIONS

First Korean Office Action dated Nov. 27, 2020; Appln. No. 10-2019-7033693.
(Continued)

*Primary Examiner* — Sanjiv D. Patel

(57) ABSTRACT

A display substrate and a display device. The display substrate includes a pixel circuit in which the driving circuit controls a driving current driving the light emitter element to emit light; the first light emission control circuit applies a first voltage to a first terminal of the driving circuit in response to a first light emission control signal; the second light emission control circuit applies the driving current to the light emitter element in response to a second light emission control signal; the first reset circuit applies a first reset voltage to the control terminal of the driving circuit in response to a first reset signal; the first reset signal and the first light emission control signal are simultaneously turn-on signals during a period; the first light emission control line and the second light emission control line extend along a first direction and are arranged in a second direction.

19 Claims, 16 Drawing Sheets

Related U.S. Application Data continuation of application No. 17/661,318, filed on Apr. 29, 2022, now Pat. No. 11,682,349, which is a continuation of application No. 17/327,937, filed on May 24, 2021, now Pat. No. 11,348,524, which is a continuation-in-part of application No. 16/650,217, filed as application No. PCT/CN2018/105999 on Sep. 17, 2018, now Pat. No. 11,030,959.

(52) U.S. Cl.
CPC ............ *G09G 2300/0819* (2013.01); *G09G 2300/0842* (2013.01); *G09G 2320/0257* (2013.01)

(56) References Cited

U.S. PATENT DOCUMENTS

| | | | |
|---|---|---|---|
| 9,564,083 | B2 | 2/2017 | Bae |
| 9,640,601 | B2 | 5/2017 | Kim |
| 10,692,430 | B2 | 6/2020 | Kim et al. |
| 11,335,267 | B2 | 5/2022 | Jeon |
| 2011/0102403 | A1 | 5/2011 | Kim |
| 2012/0001893 | A1 | 1/2012 | Jeong et al. |
| 2012/0062536 | A1 | 3/2012 | Park |
| 2013/0314308 | A1 | 11/2013 | Hsu et al. |
| 2014/0138644 | A1 | 5/2014 | Park et al. |
| 2014/0139502 | A1 | 5/2014 | Han |
| 2014/0299843 | A1* | 10/2014 | Kim ............... H01L 27/124 438/23 |
| 2014/0354518 | A1 | 12/2014 | Park et al. |
| 2015/0002560 | A1 | 1/2015 | Kwon et al. |
| 2015/0015468 | A1* | 1/2015 | Ko ................ G09G 3/3233 345/82 |
| 2015/0170576 | A1 | 6/2015 | Bae |
| 2015/0255523 | A1* | 9/2015 | Her ............... H10K 59/1213 345/76 |
| 2015/0262526 | A1 | 9/2015 | Park et al. |
| 2015/0371590 | A1 | 12/2015 | Jeong et al. |
| 2016/0133190 | A1* | 5/2016 | Kim ................ G09G 3/2011 345/80 |
| 2016/0133191 | A1 | 5/2016 | Kang et al. |
| 2016/0217739 | A1 | 7/2016 | Kang et al. |
| 2016/0275869 | A1 | 9/2016 | Hwang et al. |
| 2016/0351121 | A1 | 12/2016 | Kim et al. |
| 2017/0047010 | A1 | 2/2017 | Chen et al. |
| 2017/0116918 | A1 | 4/2017 | Dong et al. |
| 2017/0186782 | A1 | 6/2017 | Lee et al. |
| 2017/0236891 | A1 | 8/2017 | Koshihara et al. |
| 2017/0301293 | A1 | 10/2017 | Zhu et al. |
| 2018/0182302 | A1 | 6/2018 | Yoo et al. |
| 2018/0190191 | A1 | 7/2018 | Zhai et al. |
| 2018/0374415 | A1 | 12/2018 | Morita et al. |
| 2019/0073955 | A1 | 3/2019 | Zou et al. |
| 2019/0385530 | A1 | 12/2019 | Gao et al. |

FOREIGN PATENT DOCUMENTS

| | | |
|---|---|---|
| CN | 102314829 A | 1/2012 |
| CN | 103106866 A | 5/2013 |
| CN | 106531076 A | 3/2017 |
| CN | 107358920 A | 11/2017 |
| CN | 206610047 U | 11/2017 |
| CN | 107452334 A | 12/2017 |
| CN | 108983463 A | 12/2018 |
| CN | 208444534 U | 1/2019 |
| CN | 110518022 A | 11/2019 |
| EP | 3193323 A2 | 7/2017 |
| JP | 2000267590 A | 9/2000 |
| JP | 2003288055 A | 10/2003 |
| JP | 2012014136 A | 1/2012 |
| KR | 20110030210 A | 3/2011 |
| KR | 20120028013 A | 3/2012 |
| KR | 1020120043301 A | 5/2012 |
| KR | 20150070718 A | 6/2015 |
| KR | 1020160049586 A | 5/2016 |
| KR | 20160085987 A | 7/2016 |
| KR | 1020160113464 A | 9/2016 |
| KR | 20160141167 A | 12/2016 |
| KR | 20170086761 A | 7/2017 |

OTHER PUBLICATIONS

Second Korean Office Action dated May 24, 2021; Appln. No. 10-2019-7033693.
Extended European Search Report dated Apr. 15, 2021; Appln. No. 18863232.7.
USPTO NFOA dated Sep. 9, 2022 in connection with U.S. Appl. No. 17/661,318.
USPTO NFOA dated Oct. 22, 2020 in connection with U.S. Appl. No. 16/650,217.
USPTO NOA mailed Feb. 4, 2021 in connection with U.S. Appl. No. 16/650,217.
USPTO Notice of Corrected Allowability dated May 5, 2021 in connection with U.S. Appl. No. 16/650,217.
USPTO NOA mailed Jan. 27, 2022 in connection with U.S. Appl. No. 17/327,937.
USPTO NFOA dated Sep. 28, 2021 in connection with U.S. Appl. No. 17/327,937.
The Second Japanese Office Action dated Dec. 13, 2022; Appln. No. 2019-563283.
International Search Report mailed Nov. 28, 2018; PCT/CN2018/105999.
Japanese Search Report; Date of Search Jun. 29, 2022; Appln. No. 2019-563283.
First Korean Office Action dated May 20, 2022; Appln. No. 10-2022-7006828.
Korean Notice of Allowance dated Nov. 29, 2021; Appln. No. 10-2019-7033693.
International Preliminary Report on Patentability and the Written Opinion issued Nov. 28, 2018 PCT/CN2018/105999.
USPTO NFOA dated Jul. 12, 2023 in connection with U.S. Appl. No. 18/194,348.
USPTO NOA mailed Oct. 24, 2023 in connection with U.S. Appl. No. 18/194,348.
USPTO Corrected Notice of Allowability dated Nov. 8, 2023 in connection with U.S. Appl. No. 18/194,348.
USPTO Corrected Notice of Allowability dated Feb. 24, 2021 in connection with U.S. Appl. No. 16/650,217.
USPTO NOA mailed Jan. 11, 2023 in connection with U.S. Appl. No. 17/661,318.
Japanese Office Action dated Feb. 12, 2025; Appln. No. 2024-040114.

\* cited by examiner

A1-A2

DISPLAY SUBSTRATE AND DISPLAY DEVICE

This application is a continuation of U.S. application Ser. No. 18/194,348, filed Mar. 31, 2023, which is a continuation of U.S. application Ser. No. 17/661,318, filed Apr. 29, 2022, now U.S. Pat. No. 11,682,349, which is a continuation of U.S. application Ser. No. 17/327,937, filed May 24, 2021, now U.S. Pat. No. 11,348,524, which is a continuation-in-part of U.S. application Ser. No. 16/650,217, filed Mar. 24, 2020, now U.S. Pat. No. 11,030,959, which is a National Stage of International Application No. PCT/CN2018/105999, filed Sep. 17, 2018, which claims priority to and the benefit of Chinese Patent Application No. 201710917398.9 filed Sep. 30, 2017, the entireties of which are hereby incorporated herein by reference.

TECHNICAL FIELD

The embodiments of the present disclosure relate to a display substrate and a display device.

BACKGROUND

An organic light emitting diode (OLED) display device is gradually attracting attention of people because of advantages such as wide view angle, high contrast, rapid response and higher luminance and lower driving voltage compared with an inorganic light emitting display device. Due to the above characteristics, the organic light emitting diode can be applied in a device having a display function such as a cellphone, a display, a notebook computer, a digital camera, instrument and apparatus and the like.

A pixel circuit of the OLED display device usually adopts a matrix driving manner, and the matrix driving manner is categorized as active matrix (AM) driving and passive matrix (PM) driving according to whether a switch element is in each pixel unit. PMOLED is of simple process and low cost but cannot satisfy requirements of high-resolution and large-size display due to disadvantages such as crosstalk, high power consumption and short lifetime. In contrast, in AMOLED, a set of thin film transistor and storage capacitor is integrated in the pixel circuit of each pixel, and control over a current passing through the OLED is realized by controlling driving of the thin film transistor and the storage capacitor, so as to enable the OLED to emit light according to needs. Compared with PMOLED, AMOLED needs a smaller driving current and has lower power consumption and a longer lifetime, so as to be able to satisfy requirements of high-resolution, multiple-grayscale and large-size display. Meanwhile, AMOLED has obvious advantages in respects such as viewing angle, color rendition, power consumption and response time, and is applicable in a high-information content and high-resolution display device.

SUMMARY

At least one embodiment of the present disclosure further provides a display substrate, the display substrate a sub-pixel, the sub-pixel includes a pixel circuit, and the pixel circuit includes: a driving circuit, a data writing circuit, a first reset circuit, a first light emission control circuit, a second light emission control circuit, a light emitter element, a first light emission control line and a second light emission control line; the driving circuit includes a control terminal, a first terminal and a second terminal, and is configured to control a driving current flowing through the first terminal and the second terminal for driving the light emitter element to emit light; the data writing circuit is configured to write a data signal to the driving circuit in response to a scan signal; the first light emission control circuit is configured to apply a first voltage to a first terminal of the driving circuit in response to a first light emission control signal; the second light emission control circuit is configured to apply the driving current to the light emitter element in response to a second light emission control signal; the first reset circuit is configured to apply a first reset voltage to the control terminal of the driving circuit in response to a first reset signal, and the first reset signal and the first light emission control signal are simultaneously turn-on signals during at least a period of time; the first light emission control line and the second light emission control line respectively substantially extend along a first direction and are arranged in a second direction, and the second direction intersects with the first direction.

For example, in the display substrate provided by at least an embodiment of the present disclosure, the display substrate includes a plurality of light emission control lines and a plurality of the sub-pixels distributed in an array; the plurality of light emission control lines include the first light emission control line and the second light emission control line; the array includes a plurality of sub-pixel rows, each sub-pixel row of the plurality of sub-pixel rows includes the sub-pixels, a first sub-pixel row corresponds to a first one of the plurality of light emission control lines, . . . , an Nth sub-pixel row corresponds to an Nth one of the plurality of light emission control lines, and an (N+1)th sub-pixel row corresponds to an (N+1)th one of the plurality of light emission control lines, and N is an integer greater than 0; the display substrate includes: a display region, a non-display region at least partially surrounding the display region, and a peripheral circuit which is in the non-display region and is configured to provide a light emission control signal to the plurality of light emission control lines; the light emission control signal is sequentially provided from the first one of the plurality of light emission control lines to the (N+1)th one of the plurality of light emission control lines.

For example, in the display substrate provided by at least an embodiment of the present disclosure, the first light emission control line in the pixel circuit of the Nth sub-pixel row is the (N+1)th one of the plurality of light emission control lines; and the second light emission control line in the pixel circuit of the Nth sub-pixel row is the Nth one of the plurality of light emission control lines.

For example, in the display substrate provided by at least an embodiment of the present disclosure, the first light emission control line in the pixel circuit of the Nth sub-pixel row is the Nth one of the plurality of light emission control lines; and the second light emission control line in the pixel circuit of the Nth sub-pixel row is the (N+1)th one of the plurality of light emission control lines.

For example, in the display substrate provided by at least an embodiment of the present disclosure, the driving circuit includes a first transistor; a gate electrode of the first transistor serves as the control terminal of the driving circuit to connect a first node, a first electrode of the first transistor serves as the first terminal of the driving circuit to connect a second node, and a second electrode of the first transistor serves as the second terminal of the driving circuit to connect a third node; the pixel circuit further includes a storage capacitor which includes a first electrode plate and a second electrode plate, wherein the first electrode plate is electrically connected with the gate electrode of the first transistor, and the first light emission control line and the second light emission control line are arranged in a same layer as the first electrode plate.

For example, in the display substrate provided by at least an embodiment of the present disclosure, the first reset circuit includes a reset control line extending along the first direction, and the reset control line is connected with a first reset voltage terminal to provide the first reset signal; the first light emission control line, the second light emission control line and the reset control line are sequentially arranged in the second direction and are all at a same side of the storage capacitor in the second direction.

For example, in the display substrate provided by at least an embodiment of the present disclosure, the first light emission control line and the second light emission control line are at a side of the reset control line close to the storage capacitor.

For example, in the display substrate provided by at least an embodiment of the present disclosure, the display substrate includes a base substrate, and the sub-pixel is provided on the base substrate; the first transistor includes an active pattern and a gate electrode, wherein the active pattern of the first transistor includes a channel region, and an orthographic projection of the channel region of the first transistor on the base substrate overlaps with at least a part of an orthographic projection of the gate electrode of the first transistor on the base substrate; the channel region of the first transistor includes a first transverse portion, a longitudinal portion and a second transverse portion which are sequentially arranged in the first direction, wherein the first transverse portion and the second transverse portion respectively extend along the first direction and the longitudinal portion extends along the second direction; a first end of the longitudinal portion in the second direction is connected with the first transverse portion, and a second end of the longitudinal portion opposite to the first end of the longitudinal portion in the second direction is connected with the second transverse portion.

For example, in the display substrate provided by at least an embodiment of the present disclosure, the pixel circuit further includes: a semiconductor layer, a first connection structure and a second connection structure. The semiconductor layer includes the active pattern of the first transistor; the first connection structure is in a same layer as the first electrode of the first transistor and has a first end and a second end, wherein the first end of the first connection structure is electrically connected with the first electrode plate through a first via hole, and the second end of the first connection structure is electrically connected with the semiconductor layer; and the second connection structure is in a same layer as the first electrode of the first transistor and has a first end and a second end, wherein the first end of the second connection structure is electrically connected with the first electrode plate through a second via hole, and the second end of the second connection structure is electrically connected with the semiconductor layer, the first via hole is at a first end of the first electrode plate in the second direction, and the second via hole is at a second end of the first electrode plate opposite to the second end of the first electrode plate in the second direction; the first connection structure is at a first side of the first electrode plate in the second direction, and the second connection structure is at a second side of the first electrode plate opposite to the first side of the first electrode plate in the second direction.

For example, in the display substrate provided by at least an embodiment of the present disclosure, an orthographic projection of the first via hole on the first electrode plate is in a first region, and an orthographic projection of the second via hole on the first electrode plate is in a second region; an orthographic projection of the second electrode plate on a plane where the first electrode plate is located does not overlap with both the first region and the second region.

For example, in the display substrate provided by at least an embodiment of the present disclosure, the second electrode plate includes: a body portion extending along the second direction; and a protrusion portion which is connected with the body portion, protrudes from the body portion along the first direction and is at a first side of the body portion in the first direction; a size of the protrusion portion in the second direction is smaller than that of the main body in the second direction, both the first region and the second region are at the first side of the body portion, the first region is at a first side of the protrusion portion in the second direction, and the second region is at a second side of the protrusion portion opposite to the first side of the protrusion portion in the second direction.

For example, in the display substrate provided by at least an embodiment of the present disclosure, the pixel circuit further includes a first power supply line which is connected to a first voltage terminal and is configured to provide the first voltage to the pixel circuit, and is in a same layer as the first electrode of the first transistor, wherein the first power supply line is electrically connected with the second electrode plate at least through a third via hole and a fourth via hole.

For example, in the display substrate provided by at least an embodiment of the present disclosure, the pixel circuit further includes: a compensation circuit configured to store the written data signal and compensate the driving circuit in response to the scan signal; a second reset circuit configured to apply the reset voltage to the second terminal of the driving circuit in response to a second reset signal; the second reset signal is different from the first reset signal.

For example, in the display substrate provided by at least an embodiment of the present disclosure, the data writing circuit includes a second transistor, a gate electrode of the second transistor is connected to a scan signal terminal to receive the scan signal, a first electrode of the second transistor is connected to a data signal terminal to receive the data signal, and a second electrode of the second transistor is connected to the second node; the compensation circuit includes a third transistor and t storage capacitor, wherein a gate electrode of the third transistor is configured to be connected with a scan signal terminal to receive the scan signal, a first electrode of the third transistor is connected with the third node, a second electrode of the third transistor is connected with the first electrode plate of the storage capacitor, and the second electrode plate of the storage capacitor is configured to be connected with a first voltage terminal; the first reset circuit includes a fourth transistor, a gate electrode of the fourth transistor is connected to a first reset control terminal to receive the first reset signal, a first electrode of the fourth transistor is connected to the first node, and a second electrode of the fourth transistor is connected to a reset voltage terminal to receive the reset voltage; the first light emission control circuit includes a fifth transistor, a gate electrode of the fifth transistor is configured to be connected with a first light emission control terminal to receive the first light emission control signal, a first electrode of the fifth transistor is configured to be connected with the first voltage terminal to receive the first voltage, and a second electrode of the fifth transistor is connected with the second node; the second light emission control circuit includes a sixth transistor, a gate electrode of the sixth transistor is configured to be connected with a second light emission control terminal to receive the second light emission control signal, a first electrode of the sixth transistor is connected with the third node, and a second electrode of the sixth transistor is connected with a fourth node; a first electrode of the light emitter element is configured to be connected with the fourth node, and a second electrode of the light emitter element is configured to be connected with a second voltage terminal to receive a second voltage; the second reset circuit includes a seventh transistor, a gate electrode of the seventh transistor is configured to be connected with a second reset control terminal to receive the second reset signal, a first electrode of the seventh transistor is connected with the fourth node, and a second electrode of the seventh transistor is configured to be connected with a reset voltage terminal to receive the reset voltage.

For example, in the display substrate provided by at least an embodiment of the present disclosure, the pixel circuit includes a semiconductor layer, the semiconductor layer includes a first portion and a second portion, and the first portion of the semiconductor layer is spaced apart from the second portion of the semiconductor layer by an opening; a part of the first portion of the semiconductor layer constitutes the active pattern of the first transistor, an active pattern of the second transistor, an active pattern of the third transistor, an active pattern of the fourth transistor and an active pattern of the fifth transistor; a part of the second portion of the semiconductor layer constitutes an active pattern of the sixth transistor and an active pattern of the seventh transistor.

For example, in the display substrate provided by at least an embodiment of the present disclosure, the opening includes a first opening portion and a second opening portion; an orthographic projection of the first opening portion on the base substrate overlaps with an orthographic projection of the first light emission control line on the base substrate and does not overlap with an orthographic projection of the second light emission control line on the base substrate; and the second opening portion is at a side of the first opening portion away from the gate electrode of the fifth transistor in the first direction, and an orthographic projection of the second opening portion on the base substrate overlaps with the orthographic projection of the second light emission control line on the base substrate and does not overlap with the orthographic projection of the first light emission control line on the base substrate.

For example, in the display substrate provided by at least an embodiment of the present disclosure, the pixel circuit further includes a third connection structure electrically connected with the first portion of the semiconductor layer and the second portion of the semiconductor layer.

For example, in the display substrate provided by at least an embodiment of the present disclosure, the first portion of the semiconductor layer has a lower end close to the second portion of the semiconductor layer in the second direction, the second portion of the semiconductor layer has an upper end close to the first portion of the semiconductor layer in the second direction, the lower end of the first portion of the semiconductor layer and the upper end of the second portion of the semiconductor layer are opposite to each other in the second direction, and the third connection structure is connected with the lower end of the first portion of the semiconductor layer and the upper end of the second portion of the semiconductor layer.

For example, in the display substrate provided by at least an embodiment of the present disclosure, the pixel circuit includes a first power line connected with a first voltage terminal and configured to provide the first voltage to the pixel circuit; the first portion of the semiconductor layer includes a first vertical portion which substantially extends along the second direction and includes the lower end; and a second vertical portion which substantially extends along the second direction and is opposite to the first vertical portion in the first direction; the storage capacitor is between the first vertical portion and the second vertical portion; the second vertical portion has a lower end close to the second portion of the semiconductor layer in the second direction, and the first power supply line is electrically connected with the lower end of the second vertical portion through a fifth via hole.

At least one embodiment of the present disclosure further provides a display device including any one of the above-mentioned display substrates.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Because of a lag effect of a driving transistor, when a display device displays a same image for a period of time and switches the image currently displayed to a next image, the original image partially remains and emerges in the next image, and then the residual image disappears after a period of time, and this phenomenon is called short-term residual image. The lag effect is mainly caused by a shift of a threshold voltage (Vth) caused by movable ions remaining in holes. A $V_{GS}$ (voltage difference between a gate electrode of the driving transistor and a source electrode of the driving transistor) in an initialization stage may be different during switching of different images, and therefore it may cause the shifts of the threshold voltage of the driving transistor to different degrees, resulting in the short-term residual image.

Figure 1A:
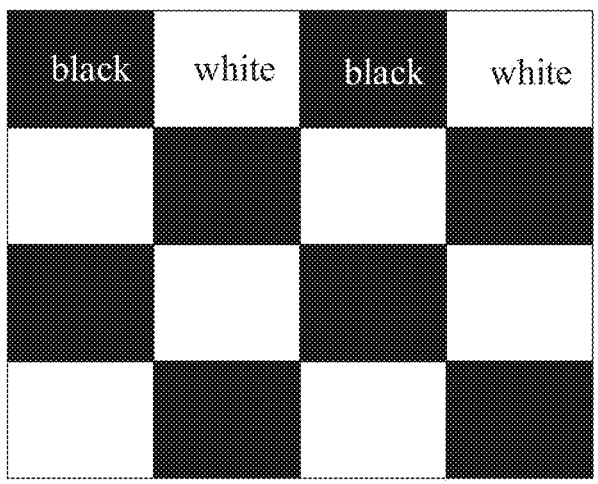
FIG. 1A is a schematic diagram of image one displayed by a display device.
Figure 1B:
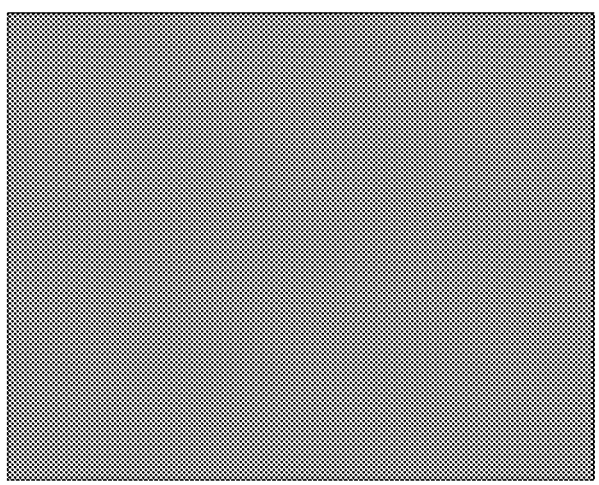
FIG. 1B is a schematic diagram of image two to be displayed by the display device.
Figure 1C:
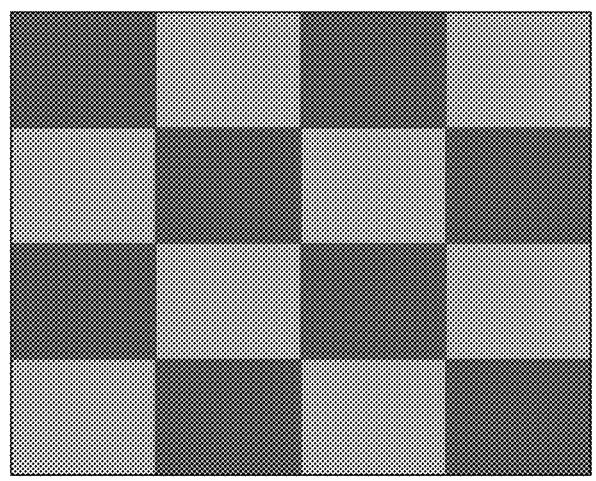
FIG. 1C is a schematic diagram of image two actually displayed by the display device.

For example, FIG. 1A is a schematic diagram of image one displayed by a display device, FIG. 1B is a schematic diagram of image two to be displayed by the display device, and FIG. 1C is a schematic diagram of the image two actually displayed by the display device. After the display device displays the image one such as a black-and-white checkerboard image as illustrated in FIG. 1A for a period of time, when the image displayed by the display device is switched to the new image two such as an image with a gray scale of 48 as illustrated in FIG. 1B, the checkerboard image as illustrated in FIG. 1A still partially remains, and the image actually displayed is illustrated in FIG. 1C.

At least an embodiment of the present disclosure provides a pixel circuit, and the pixel circuit includes a driving circuit, a data writing circuit, a first reset circuit, a first light emission control circuit and a light emitter element. The driving circuit includes a control terminal, a first terminal and a second terminal, and the driving circuit is configured to control a driving current which passes through the first terminal and the second terminal, and the driving current is used to drive the light emitter element to emit light; the data writing circuit is configured to write a data signal into the control terminal of the driving circuit in response to a scan signal; the first light emission control circuit is configured to apply a first voltage to the first terminal of the driving circuit in response to a first light emission control signal; the first reset circuit is configured to apply a reset voltage to the control terminal of the driving circuit in response to a first reset signal, and the driving circuit is configured to be in a fixed bias state when the reset voltage and the first voltage are applied simultaneously to the driving circuit. The embodiments of the present disclosure further provide a driving method corresponding to the above mentioned pixel circuit and a display device.

The pixel circuit, the driving method thereof and the display device provided by the embodiments of the present disclosure can enable the driving transistor to be in an on state where $V_{GS}$ is under fixed bias in an initialization stage, and then enable the driving transistor to start to enter a data writing and compensation stage, for example, so as to reduce the phenomenon of the short-term residual image possibly caused by the lag effect.

Figure 2:
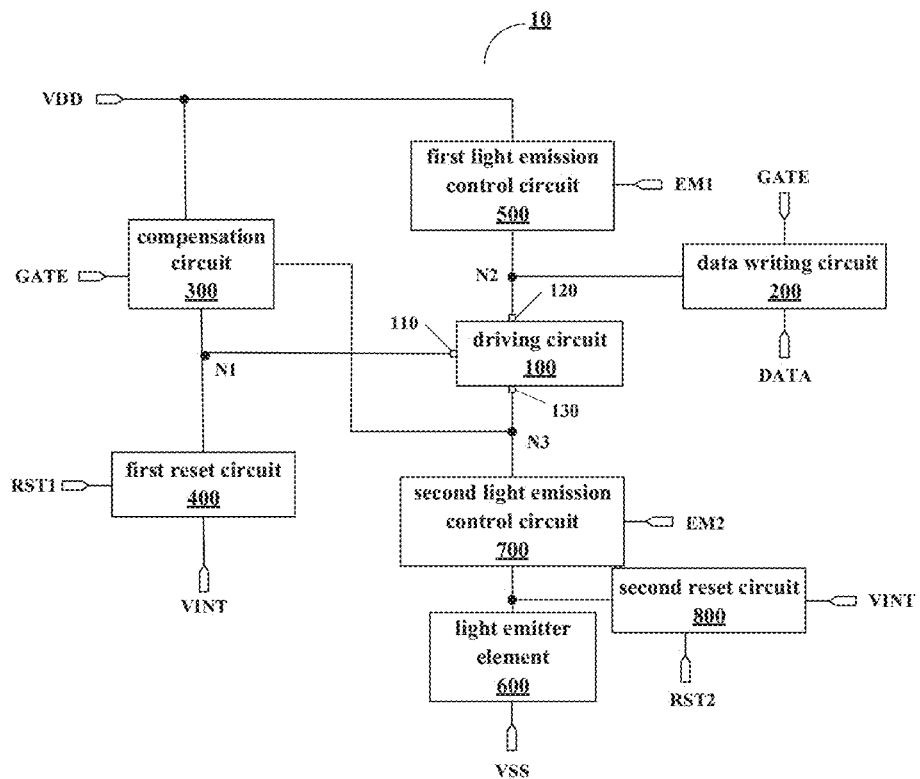
FIG. 2 is a schematic block diagram of a pixel circuit provided by an embodiment of the present disclosure.

An embodiment of the present disclosure provides a pixel circuit 10, and the pixel circuit 10 can be used for a sub-pixel of an OLED display device, for example. As illustrated in FIG. 2, the pixel circuit 10 includes a driving circuit 100, a data writing circuit 200, a compensation circuit 300, a first reset circuit 400, a first light emission control circuit 500 and a light emitter element 600.

For example, the driving circuit 100 includes a control terminal 110, a first terminal 120 and a second terminal 130, the driving circuit 100 is connected with the data writing circuit 200, the compensation circuit 300, the first reset circuit 400 and the first light emission control circuit 500, and the driving circuit 100 is configured to control a driving current that passes through the first terminal 120 and the second terminal 130, and the driving current is used to drive the light emitter element 600 to emit light. For example, in a light emission stage, the driving circuit 100 provides the driving current to the light emitter element 600 to drive the light emitter element 600 to emit light and for example, the light emitter element 600 can emit light according to a desired "gray scale". For example, the light emitter element 600 adopts an OLED, and embodiments of the present disclosure include but are not limited to this.

For example, the data writing circuit 200 is connected with the driving circuit 100 and the first light emission control circuit 500, and the data writing circuit 200 is configured to write a data signal DATA into the control terminal 110 of the driving circuit 100 in response to a scan signal GATE. For example, in the data writing and compensation stage, the data writing circuit 200 is turned on in response to the scan signal GATE, thereby writing a data signal DATA into the control terminal 110 of the driving circuit 100 and storing the data signal DATA in the compensation circuit 300, so that the driving current for driving the light emitter element 600 to emit light is generated according to the data signal DATA in the light emission stage, for example.

For example, the compensation circuit 300 is connected with the driving circuit 100 and the first reset circuit 400, and the compensation circuit 300 is configured to store the data signal DATA that is written in and to compensate the driving circuit 100 in response to the scan signal GATE. For example, in a case where the compensation circuit 300 includes a storage capacitor, the compensation circuit 300 is turned on in response to the scan signal GATE in the data writing and compensation stage, so as to store the data signal DATA that is written in by the data writing circuit 200 in the storage capacitor. For example, simultaneously, in the data writing and compensation stage, the compensation circuit 300 electrically connects the control terminal 110 of the driving circuit 100 and the second terminal 130 of the driving circuit 100, so that relevant information of the threshold voltage of the driving circuit 100 can be correspondingly stored in the storage capacitor, and thus the driving circuit 100 can be controlled by using the stored data including the data signal DATA and the threshold voltage in the light emission stage, so that the driving circuit 100 can be compensated.

For example, the first light emission control circuit 500 is connected with the driving circuit 100 and the data writing circuit 200, and the first light emission control circuit 500 is configured to apply a first voltage VDD to the first terminal 120 of the driving circuit 100 in response to a first light emission control signal EM1. For example, in the initialization stage, the first light emission control circuit 500 is turned on in response to the first light emission control signal EM1, so as to apply the first voltage VDD to the first terminal 120 of the driving circuit 100. For another example, in the light emission stage, the first light emission control circuit 500 is turned on in response to the first light emission control signal EM1, so as to apply the first voltage VDD to the first terminal 120 of the driving circuit 100. When the driving circuit 100 is turned on, it is easy to understand that an electric potential of the second terminal 130 is also VDD. Then, the driving circuit 100 applies the first voltage VDD to the light emitter element 600 to provide a driving voltage to drive the light emitter element to emit light. For example, the first voltage VDD is the driving voltage, which is, for example, a high voltage.

For example, the first reset circuit 400 is connected with the driving circuit 100 and the compensation circuit 300, and the first reset circuit 400 is configured to apply a reset voltage VINT to the control terminal 110 of the driving circuit 100 in response to a first reset signal RST1. For example, in the initialization stage, the first reset circuit 400 is turned on in response to the first reset signal RST1, so as to apply the reset voltage VINT to the control terminal 110 of the driving circuit, and the first reset circuit 400 is configured to allow the driving circuit to be in a fixed bias state, for example, an on state of fixed bias, when the reset voltage VINT and the first voltage VDD are applied together.

In a case where the driving circuit 100 is implemented as a driving transistor, for example, a gate electrode of the driving transistor serves as the control terminal of the driving circuit 100, a first electrode (for example, a source electrode) serves as the first terminal of the driving circuit 100, and a second electrode (for example, a drain electrode) serves as the second terminal of the driving circuit 100.

For example, the first reset signal RST1 and the first light emission control signal EM1 are both turn-on signals during at least a period of time. For example, in the initialization stage of the above pixel circuit 10, the first reset signal RST1 and the first light emission control signal EM1 are both turn-on signals, so that the reset voltage VINT can be applied to the gate electrode of the driving transistor while the first voltage VDD is applied to the source electrode of the driving transistor. Therefore, the voltage $V_{GS}$ for driving the gate electrode and the source electrode of the driving transistor can satisfies: $|V_{GS}|>|V_{th}|$ ($V_{th}$ represents the threshold voltage of the driving transistor, for example, $V_{th}$ is a negative value in a case where the driving transistor is a p-type transistor), so that the driving transistor is in the on state where $V_{GS}$ is under the fixed bias. With this configuration, it can be realized that whether the data signal DATA of a previous frame is a black state signal or a white state signal, the driving transistor starts to enter the data writing and compensation stage from the on state of the fixed bias, for example. Thereby, the phenomenon of short-term residual image possibly caused by the lag effect of the display device adopting the pixel circuit can be reduced.

For example, as illustrated in FIG. 2, in another embodiment of the present disclosure, the pixel circuit 10 further includes a second light emission control circuit 700 which is connected with the driving circuit 100, the compensation circuit 300 and the light emitter element 600, and which is configured to apply the driving current to the light emitter element 600 in response to a second light emission control signal EM2.

For example, in the light emission stage, the second light emission control circuit 700 is turned on in response to the second light emission control signal EM2, so that the driving circuit 100 applies the driving current to the light emitter element 600 by means of the second light emission control circuit 700 to drive the light emitter element 600 to emit light; in a non-light emission stage, the second light emission control circuit 700 is turned off in response to the second light emission control signal EM2, thereby preventing the light emitter element 600 from emitting light and providing contrast of the corresponding display device.

For example, in some examples, the second light emission control circuit 700 is turned on in response to the second light emission control signal EM2 in a reset stage, so that the second light emission control circuit 700 can combine with other reset circuit to perform reset operations on the driving circuit 100 and the light emitter element 600.

For example, the second light emission control signal EM2 is different from the first light emission control signal EM1. For example, the second light emission control signal EM2 and the first light emission control signal EM1 are connected with different signal output terminals, and as described above, for example, the second light emission control signal EM2 may be individually a turn-on signal in the reset stage. For example, the first light emission control signal and the second light emission control signal are both turn-on signals during at least a period of time. For example, in the light emission stage, the first light emission control signal EM1 and the second light emission control signal EM2 are both turn-on signals to drive the light emitter element 600 to emit light.

It should be noted that in the embodiments of the present disclosure, the first light emission control signal EM1 and the second light emission control signal EM2 are used to distinguish two light emission control signals with different timing. For example, in a display device, in a case where the pixel circuits 10 are arranged in an array, the first light emission control signal EM1 may be a control signal for controlling the first light emission control circuit 500 in a present row of pixel circuits 10, while the first light emission control signal EM1 also controls the second light emission control circuit 700 in a next row of pixel circuits 10; similarly, the second light emission control signal EM2 is a control signal for controlling the second light emission control circuit 700 in the present row of pixel circuits 10, while the second light emission control signal EM2 also controls the first light emission control circuit 500 in a previous row of pixel circuits 10.

For example, as illustrated in FIG. 2, in another embodiment of the present disclosure, the pixel circuit 10 may further include a second reset circuit 800, the second reset circuit 800 is connected with the second light emission control circuit 700 and the light emitter element 600, and the second reset circuit 800 is configured to apply a reset voltage (for example, also VINT) to the second terminal 130 of the driving circuit 100 in response to a second reset signal RST2.

For example, in the reset stage, the second reset circuit 800 is turned on in response to the second reset signal RST2, and the second light emission control circuit 700 is also turned on simultaneously in this stage as described above, so that the reset voltage VINT is applied to the second terminal 130 of the driving circuit 100 to realize the reset operation.

For example, the second reset signal RST2 is different from the first reset signal RST1, and the second reset signal RST2 and the first reset signal RST1 may be connected with different signal output terminals. For example, the first reset signal RST1 and the second reset signal RST2 are configured to be respectively provided by two different reset control lines. For example, in a display device, in the case where the pixel circuits 10 are arranged in an array, the first reset signal RST1 is provided by a scan signal line of the previous row, and the second reset signal RST2 is provided by a scan signal line of the next row.

Figure 3:
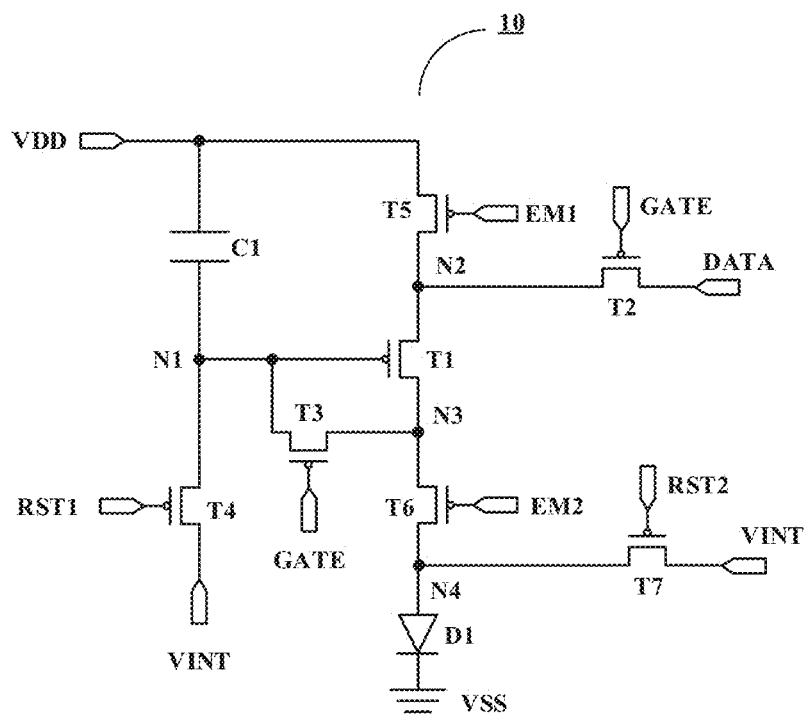
FIG. 3 is a circuit diagram of an example of the pixel circuit as illustrated in FIG. 2.

For example, the pixel circuit 10 illustrated in FIG. 2 is implemented as the structure of the pixel circuit illustrated in FIG. 3. As illustrated in FIG. 3, the pixel circuit 10 includes a first transistor T1, a second transistor T2, a third transistor T3, a fourth transistor T4, a fifth transistor T5, a sixth transistor T6 and a seventh transistor T7, and includes a storage capacitor C1 and a light emitter element D1. For example, the first transistor T1 is used as a driving transistor, and the rest second to seventh transistors are used as switching transistors. For example, the light emitter element D1 is an OLED, and the embodiments of the present disclosure include but are not limited to this. The following embodiments are all described by taking that the light emitter element D1 is the OLED as an example and are not described in detail. The OLED may be of various types, such as top emission, bottom emission or the like, and the OLED may emit red light, green light, blue light, white light, or the like. The embodiments of the present disclosure impose no limitation to this.

For example, as illustrated in FIG. 3, more specifically, the driving circuit 100 may be implemented as the first transistor T1. A gate electrode of the first transistor T1 functions as the control terminal 110 of the driving circuit 100 and is connected with a first node N1, a first electrode of the first transistor T1 functions as the first terminal 120 of the driving circuit 100 and is connected with a second node N2, and a second electrode of the first transistor T1 functions as the second terminal 130 of the driving circuit 100 and is connected with a third node N3. For example, the first transistor T1 is in a fixed bias state, for example, in an on state of the fixed bias when the reset voltage VINT and the first voltage VDD are applied simultaneously to the first transistor T1.

The data writing circuit 200 may be implemented as the second transistor T2. A gate electrode of the second transistor T2 is configured to be connected with a scan signal terminal to receive the scan signal GATE, a first electrode of the second transistor T2 is configured to be connected with a data signal terminal to receive the data signal DATA, and a second electrode of the second transistor T2 is connected with the second node N2.

The compensation circuit 300 may be implemented to include the third transistor T3 and the storage capacitor C1. A gate electrode of the third transistor T3 is configured to be connected with the scan signal terminal to receive the scan signal GATE, a first electrode of the third transistor T3 is connected with the third node N3, a second electrode of the third transistor T3 is connected with a first electrode (the first node N1) of the storage capacitor C1, and a second electrode of the storage capacitor C1 is configured to be connected with the first voltage terminal to receive the first voltage VDD.

The first reset circuit 400 may be implemented as the fourth transistor T4. A gate electrode of the fourth transistor is configured to be connected with a first reset control terminal to receive the first reset signal RST1, a first electrode of the fourth transistor is connected with the first node, and a second electrode of the fourth transistor is configured to be connected with a reset voltage terminal to receive the reset voltage VINT.

The first light emission control circuit 500 may be implemented as the fifth transistor T5. A gate electrode of the fifth transistor T5 is configured to be connected with a first light emission control terminal to receive the first light emission control signal EM1, a first electrode of the fifth transistor T5 is configured to be connected with the first voltage terminal to receive the first voltage VDD, and a second electrode of the fifth transistor T5 is connected with the second node N2.

The second light emission control circuit 700 may be implemented as the sixth transistor T6. A gate electrode of the sixth transistor T6 is configured to be connected with a second light emission control terminal to receive the second light emission control signal EM2, a first electrode of the sixth transistor T6 is connected with a third node N3, a second electrode of the sixth transistor T6 is connected with a fourth node N4.

A first electrode (anode) of the light emitter element D1 is configured to be connected with the fourth node N4, and a second electrode (cathode) of the light emitter element D1 is configured to be connected with a second voltage terminal to receive a second voltage VSS. For example, the second voltage terminal may be grounded, that is, VSS may be 0V.

The second reset circuit 800 may be implemented as the seventh transistor T7. A gate electrode of the seventh transistor T7 is configured to be connected with a second reset control terminal to receive a second reset signal RST2, a first electrode of the seventh transistor T7 is connected with the fourth node N4, and a second electrode of the seventh transistor T7 is configured to be connected with the reset voltage terminal to receive the reset voltage VINT. For example, the reset voltage VINT is 0V (or other low-level signals, etc.).

It should be noted that all the transistors adopted in the embodiments of the present disclosure may be thin film transistors, field-effect transistors or other switchers with same characteristics and thin film transistors are taken as an example to illustrated in the embodiments of the present disclosure. Source electrodes and drain electrodes of the transistors adopted herein may be symmetric in structure, so there is no difference between the source electrodes and drain electrodes in structure. In the embodiments of the present disclosure, in order to distinguish the two electrodes apart from the gate electrode, one electrode of the source electrode and the drain electrode is described as the first electrode and the other electrode of the source electrode and the drain electrode is described as the second electrode.

Additionally, it should be noted that the transistors in the embodiments of the present disclosure are all described by taking P-type transistors as an example. In this case, the first electrode may be the source electrode and the second electrode may be the drain electrode. As illustrated in FIG. 3, the cathode of the light emitter element D1 in the pixel circuit 10 is connected with the second voltage terminal to receive the second voltage VSS. For example, in a display device, in the case where the pixel circuits 10 illustrated in FIG. 3 are arranged in an array, the cathodes of the light emitter elements D1 may be electrically connected with a same voltage terminal, that is, the manner that the light emitter elements D1 are connected by sharing one cathode is adopted.

Figure 9:
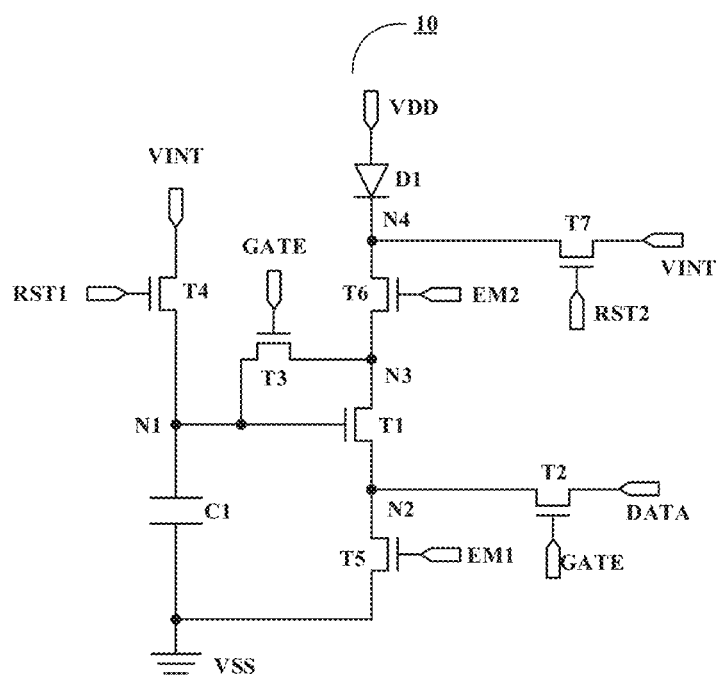
FIG. 9 is another circuit diagram of the pixel circuit provided by an embodiment of the present disclosure.

The embodiments of the present disclosure include but are not limited to the configuration mode in FIG. 3. For example, as illustrated in FIG. 9, in another embodiment of the present disclosure, the transistors in the pixel circuit 10 may all adopt N-type transistors, in this case, the first electrode may be the drain electrode and the second electrode may be the source electrode. In the embodiment illustrated in FIG. 9, the anode of the light emitter element D1 in the pixel circuit 10 is connected with the first voltage terminal to receive the first voltage VDD. For example, in a display device, in the case where the pixel circuits 10 illustrated in FIG. 9 are arranged in an array, the anodes of the light emitter elements D1 may be electrically connected with a same voltage terminal (for example, a common voltage terminal), that is, a connection mode that the light emitter elements D1 share one anode is adopted. The connection relationship of other transistors in this embodiment is illustrated in FIG. 9 and is not be repeated here.

For another example, the transistors in the embodiments of the present disclosure may include both P-type transistors and N-type transistors, and it is only required that polarities of terminals of the selected types of transistors are connected correspondingly according to the polarities of the terminals of the corresponding transistors in the embodiments of the present disclosure.

Figure 15:
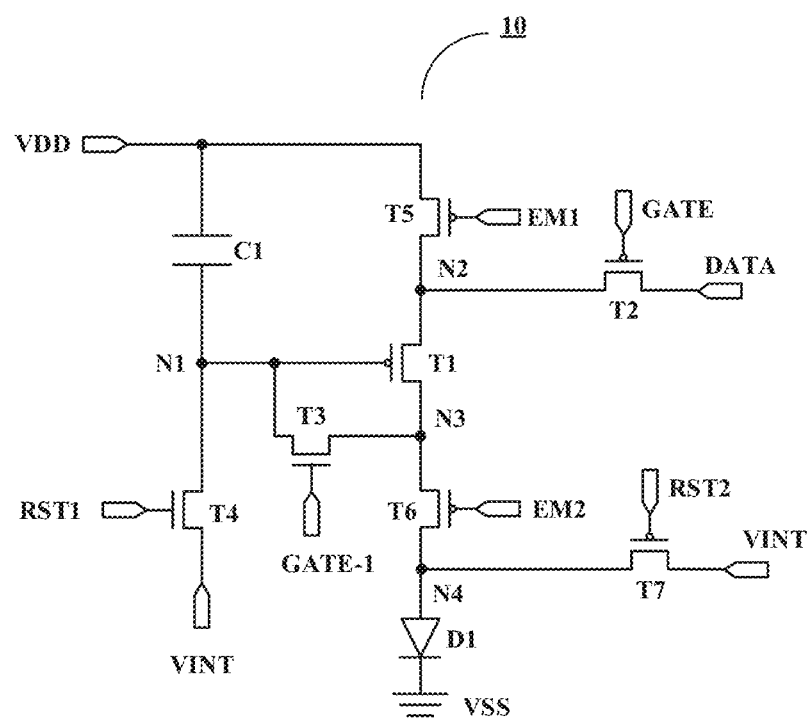
FIG. 15 is a schematic diagram of another pixel circuit provided by an embodiment of the present disclosure.
Figure 16:
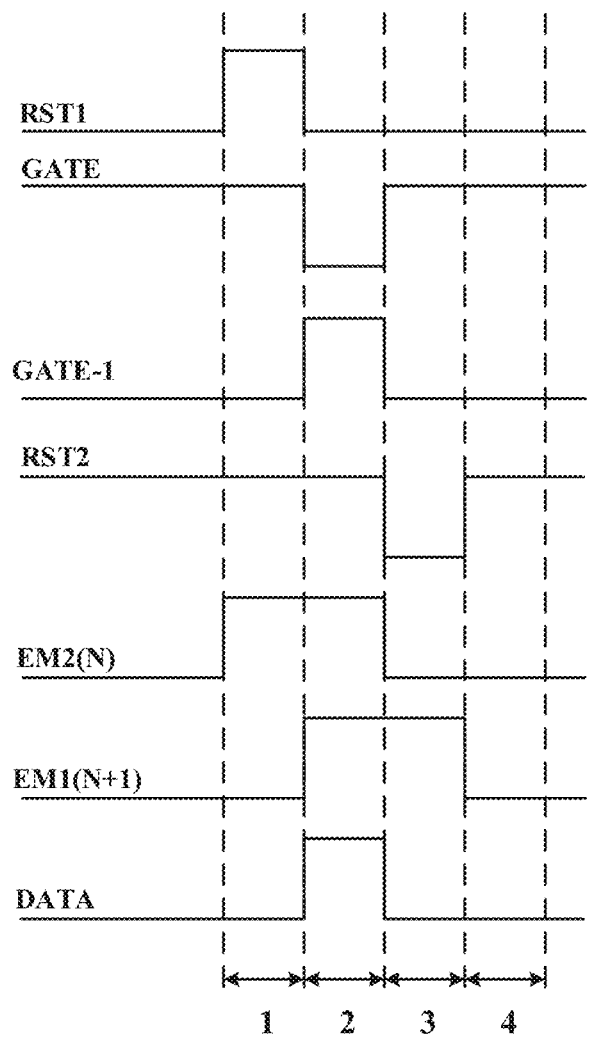
FIG. 16 is a signal timing chart of the pixel circuit shown in FIG. 15.

FIG. 15 is a schematic diagram of another pixel circuit provided by an embodiment of the present disclosure; FIG. 16 is a signal timing chart of the pixel circuit shown in FIG. 15. In FIG. 15, the third transistor T3 of the compensation circuit is an N-type transistor, and the fourth transistor T4 of the first reset circuit is an N-type transistor.

Figure 4:
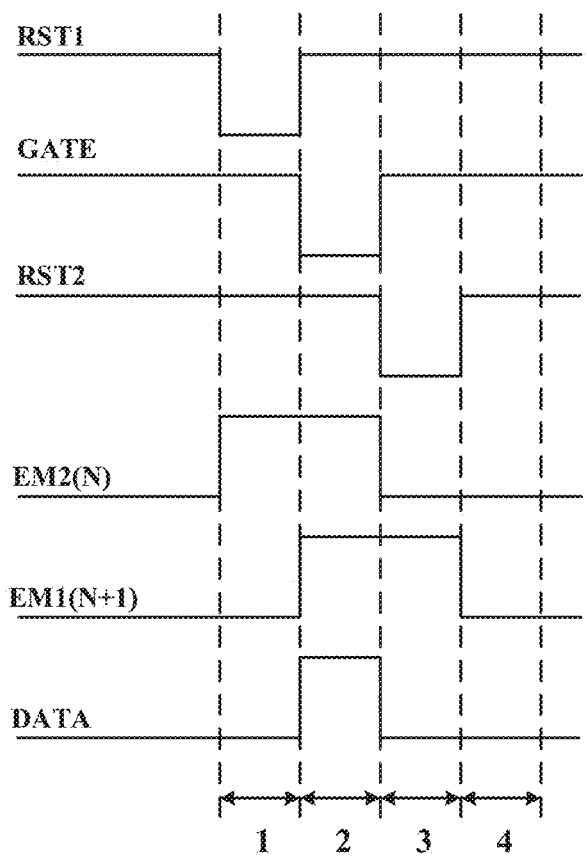
FIG. 4 is a signal timing diagram corresponding to operation of the pixel circuit shown in FIG. 3.

The operation principle of the pixel circuit 10 illustrated in FIG. 3 is described below with reference to a signal timing diagram illustrated in FIG. 4. As illustrated in FIG. 4, the operation of the pixel circuit 10 includes four stages, namely the initialization stage 1, the data writing and compensation stage 2, the reset stage 3 and the light emission stage 4, and timing waveform of each signal in each stage is illustrated in FIG. 4.

Figure 5:
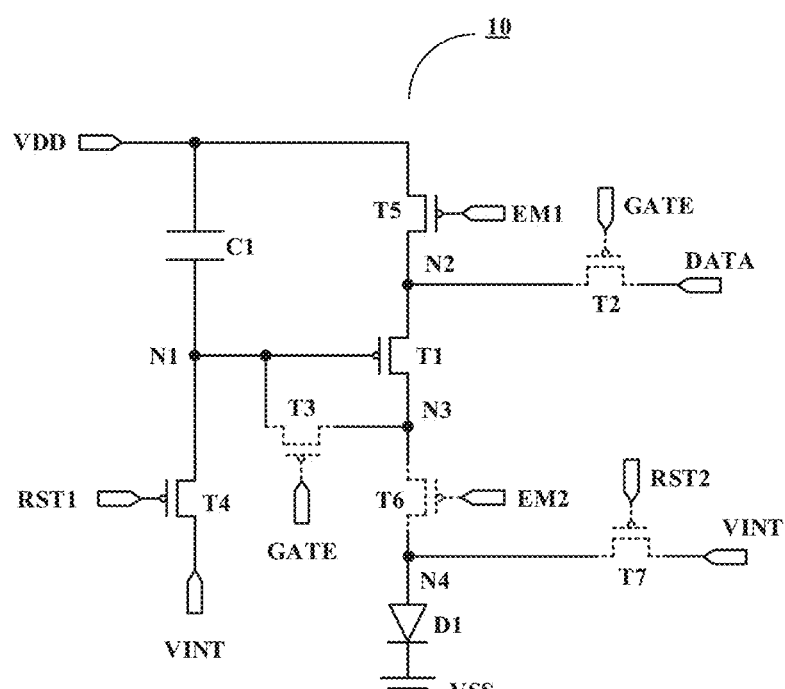
FIG. 5 to FIG. 8 are respectively schematic circuit diagrams of the pixel circuit as illustrated in FIG. 3 corresponding to four signal timing stages in FIG. 4.
Figure 6:
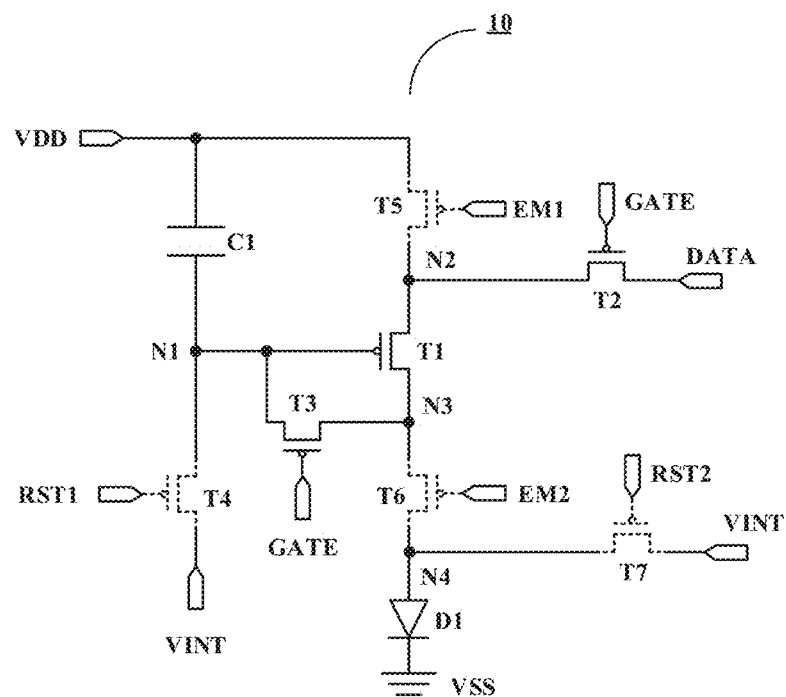
Figure 7:
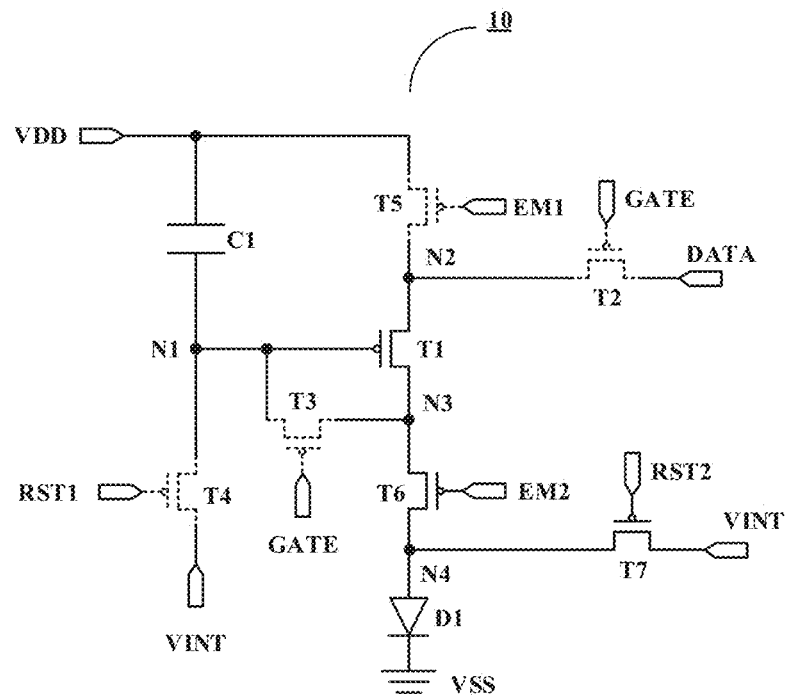
Figure 8:
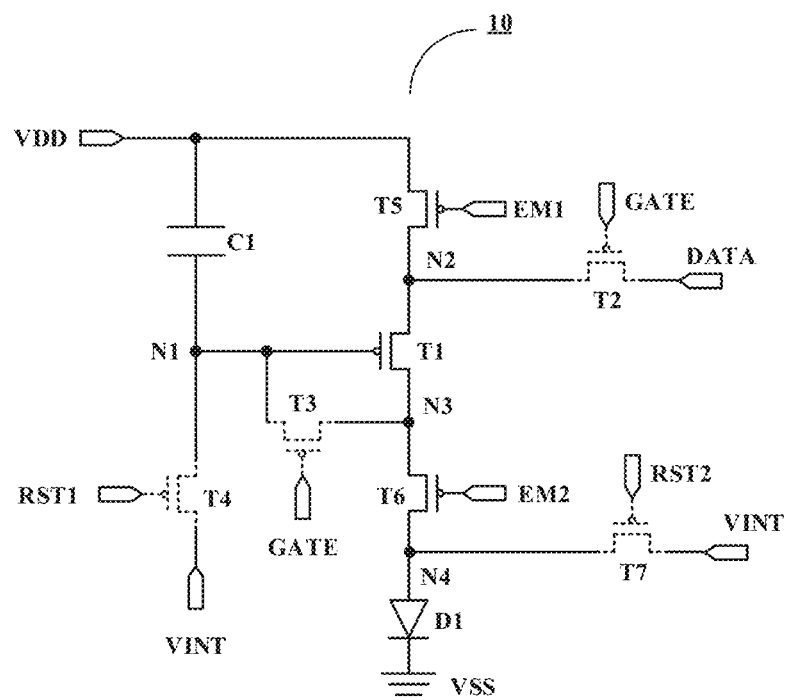

It should be noted that FIG. 5 is a schematic diagram when the pixel circuit 10 illustrated in FIG. 3 is in the initialization stage 1, FIG. 6 is a schematic diagram when the pixel circuit 10 illustrated in FIG. 3 is in the data writing and compensation stage 2, FIG. 7 is a schematic diagram when the pixel circuit 10 illustrated in FIG. 3 is in the reset stage 3, and FIG. 8 is a schematic diagram when the pixel circuit 10 illustrated in FIG. 3 is in the light emission stage 4. In addition, the transistors identified by dashed lines in FIG. 5 to FIG. 8 all indicate that they are in an off state in the corresponding stages. The transistors illustrated in FIG. 5 to FIG. 8 all take P-type transistors as an example, that is, the gate electrode of each transistor is turned on when a low level is input and is turned off when a high level is input.

In the initialization stage 1, the first reset signal RST1 is input, the first reset circuit 400 is turned on, and the reset voltage VINT is applied to the control terminal 110 of the driving circuit 100; the first light emission control signal EM1 is input, the first light emission control circuit 500 is turned on, and the first voltage VDD is applied to the first terminal 120 of the driving circuit 100.

As illustrated in FIG. 4 and FIG. 5, in the initialization stage 1, the fourth transistor T4 is turned on by a low level of the first reset signal RST1, and the fifth transistor T5 is turned on by a low level of the first light emission control signal EM1; at the same time, the second transistor T2, the third transistor T3, the sixth transistor T6 and the seventh transistor T7 are turned off by high-level signals respectively input thereto.

In the initialization stage 1, because the fourth transistor T4 is turned on, the reset voltage VINT (a low-level signal which may be grounded or other low-level signal, for example) may be applied to the gate electrode of the first transistor T1. At the same time, because the fifth transistor T5 is turned on, the first voltage VDD (a high level signal) may be applied to the source electrode of the first transistor T1, so that in this stage, the voltage difference $V_{GS}$ between the gate electrode of the first transistor T1 and the source electrode of the first transistor T1 satisfy: $|V_{GS}|>|Vth|$ (Vth is the threshold voltage of the first transistor T1, for example, Vth is a negative value when the first transistor T1 is a P-type transistor), thereby allowing the first transistor T1 to be in the on state in which $V_{GS}$ is under the fixed bias. With this configuration, it can be realized that whether the data signal DATA of the previous frame is a black-state signal or a white-state signal, the first transistor T1 starts to enter the data writing and compensation stage 2 from the on state of the fixed bias, thereby inhibiting the phenomenon of short-term residual image that may occur because of the lag effect in the display device adopting the pixel circuit 10.

In the data writing and compensation stage 2, the scanning signal GATE and the DATA signal DATA are input, and the data writing circuit 200, the driving circuit 100 and the compensation circuit 300 are turned on; the data writing circuit 200 writes the data signal DATA into the driving circuit 100, and the compensation circuit 300 compensates the driving circuit 100.

As illustrated in FIG. 4 and FIG. 6, in the data writing and compensation stage 2, the second transistor T2 and the third transistor T3 are turned on by a low level of the scan signal GATE. At the same time, the fourth transistor T4, the fifth transistor T5, the sixth transistor T6 and the seventh transistor T7 are turned off by high-level signals respectively input thereto.

As illustrated in FIG. 6, in the data writing and compensation stage 2, the data signal DATA passes through the second transistor T2, the first transistor T1 and the third transistor T3 to charge the first node N1 (that is, to charge the storage capacitor C1), that is, the electric potential of the first node N1 becomes larger. It is easy to understand that the electric potential of the second node N2 is maintained at Vdata, and at the same time, according to the own characteristics of the first transistor T1, when the electric potential of the first node N1 increases to Vdata+Vth, the first transistor T1 is turned off and the charging process ends. It should be noted that Vdata represents the voltage value of the data signal DATA, and Vth represents the threshold voltage of the first transistor. In this embodiment, the pixel circuit is described by taking that the first transistor T1 is a P-type transistor as an example, so the threshold voltage Vth may be a negative value here.

After the data writing and compensation stage 2, the electric potentials of the first node N1 and the third node N3 are both Vdata+Vth, that is, voltage information with the data signal DATA and the threshold voltage Vth is stored in the storage capacitor C1 for providing gray scale display data and compensating for the threshold voltage of the first transistor T1 itself in the subsequent light emission stage.

In the reset stage 3, the second light emission control signal EM2 and the second reset signal RST2 are input, the second light emission control circuit 700 and the second reset circuit 800 are turned on, and the driving circuit 100, the compensation circuit 300 and the light emitter element 600 are reset.

As illustrated in FIG. 4 and FIG. 7, in the reset stage 3, the sixth transistor T6 is turned on by a low level of the second light emission control signal EM2, and the seventh transistor T7 is turned on by a low level of the second reset signal RST2; at the same time, the second transistor T2, the third transistor T3, the fourth transistor T4 and the fifth transistor T5 are turned off by high levels respectively input thereto.

As illustrated in FIG. 7, in the reset stage 3, because the reset voltage VINT is a low-level signal (for example, it may be grounded or other low-level signal), the drain electrode of the first transistor T1 is discharged by means of the sixth transistor T6 and the seventh transistor T7, thereby resetting the electric potentials of the third node N3 and the fourth node N4 at the same time.

In the reset stage 3, the drain electrode of the first transistor T1 is reset, so that the electric potential of the drain electrode of the first transistor T1 can be kept at a fixed electric potential without affecting the display effect of the display device adopting the above pixel circuit because of the uncertainty of the electric potential of the drain electrode of the first transistor T1. At the same time, the fourth node N4 is also reset, that is, the OLED is reset, so that the OLED displays in a black state without emitting light before the light emission stage 4, and the display effect such as contrast of the display device adopting the pixel circuit 10 described above is improved.

In the light emission stage 4, the first light emission control signal EM1 and the second light emission control signal EM2 are input, the first light emission control circuit 500, the second light emission control circuit 700 and the driving circuit 100 are turned on, and the second light emission control circuit 700 applies the driving current to the light emitter element 600 to drive the light emitter element 600 to emit light.

As illustrated in FIG. 4 and FIG. 8, in the light emission stage 4, the fifth transistor T5 is turned on by the low level of the first light emission control signal EM1, and the sixth transistor T6 is turned on by the low level of the second light emission control signal EM2; the second transistor T2, the third transistor T3, the fourth transistor T4 and the seventh transistor T7 are turned off by high levels respectively input thereto; at the same time, the electric potential of the first node N1 is Vdata+Vth, and the electric potential of the second node N2 is VDD, and therefore the first transistor T1 is also kept on at this stage.

As illustrated in FIG. 8, in the light emission stage 4, the anode and the cathode of the light emitter element D1 are respectively input with the first voltage VDD (high voltage) and the second voltage VSS (low voltage), so that the light emitter element D1 emits light under the action of the driving current that passes through the first transistor T1.

Specifically, the value of the driving current ID1 that passes through the light emitter element D1 can be obtained according to the following formula:

$$I_{D1} = K(V_{GS} - Vth)^2$$
$$= K[(Vdata + Vth - VDD) - Vth]^2.$$
$$= K(Vdata - VDD)^2$$

In the above formula, Vth represents the threshold voltage of the first transistor T1, $V_{GS}$ represents the voltage difference between the gate electrode of the first transistor T1 and the source electrode of the first transistor T1, and K is a constant value. It can be seen from the above formula that the driving current ID1 passing through the light emitter element D1 is no longer related to the threshold voltage Vth of the first transistor T1, but only related to the voltage Vdata of the data signal DATA controlling the light emission gray scale of the pixel circuit, thereby realizing compensation for the pixel circuit, solving the threshold voltage drift of the driving transistor (the first transistor T1 in the embodiments of the present disclosure) caused by the manufacturing process and long-term operation, eliminating influence of the threshold voltage drift on the driving current ID1, and thus improving the display effect.

Figure 10:
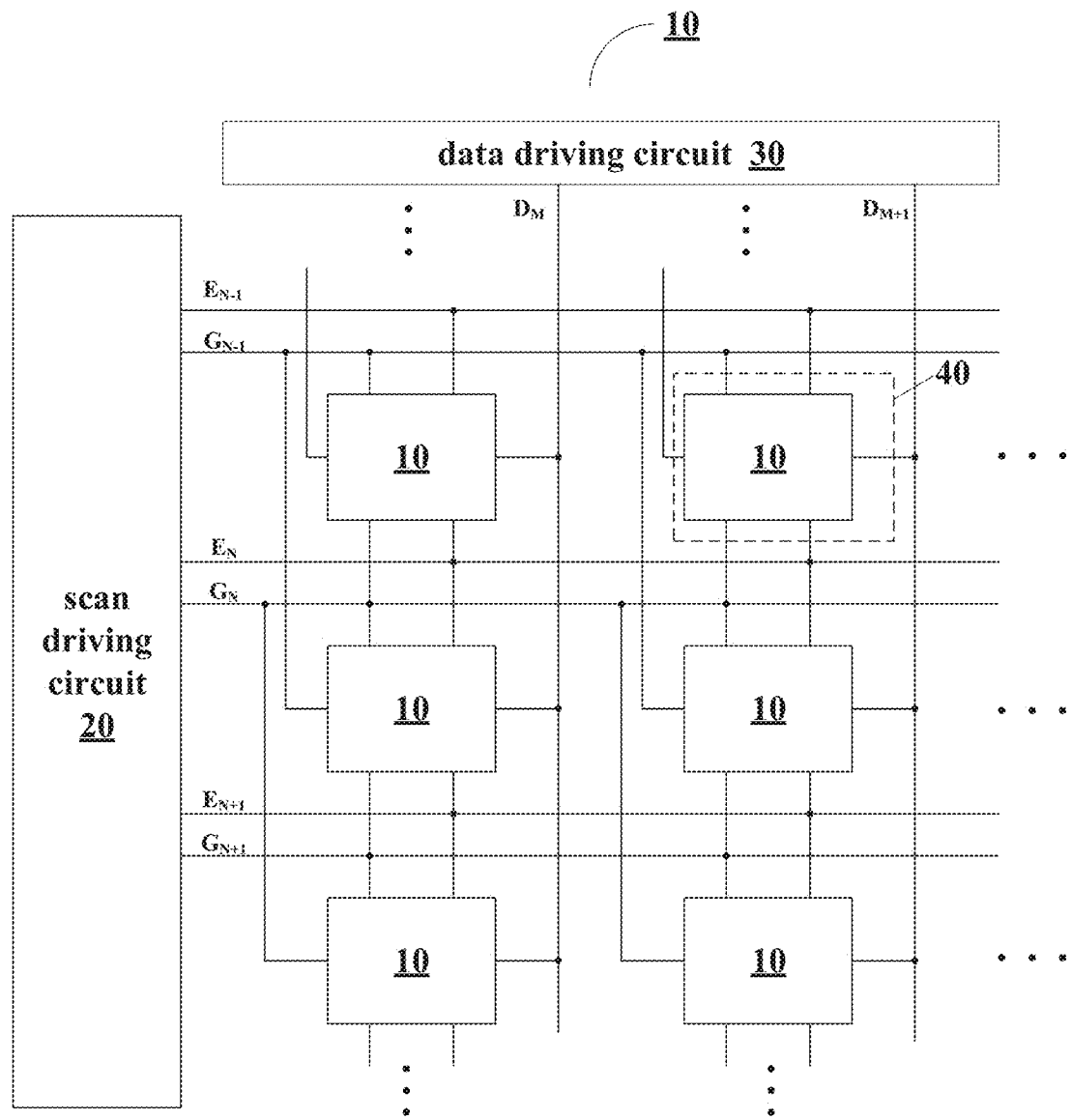
FIG. 10 is a schematic diagram of the display device provided by an embodiment of the present disclosure.

At least one embodiment of the present disclosure further provides a display device 1. As illustrated in FIG. 10, the display device 1 includes a plurality of pixel units 40 arranged in an array, a plurality of scan signal lines, a plurality of data signal lines and a plurality of light emission control lines. It should be noted that only a part of the pixel units 40, the scan signal lines, the data signal lines and the light emission control lines are illustrated in FIG. 10, and embodiments of the present disclosure include but are not limited to this. For example, $G_{N-1}$ represents the scan signal line of an (N−1)th row, $G_N$ represents the scan signal line of an Nth row, $G_{N+1}$ represents the scan signal line of an (N+1)th row; $E_{N-1}$ represents the light emission control line of the (N−1)th row, $E_N$ represents the light emission control line of the Nth row, and $E_{N+1}$ represents the light emission control line of the (N+1)th row; $D_M$ represents the data signal line of an Mth column, and $D_{M+1}$ represents the data signal line of an (M+1)th column. Here, N is, for example, an integer larger than 1, and M is, for example, an integer larger than 0.

For example, each of the pixel units 40 includes the pixel circuit 10 provided in any one of the above embodiments; for example, each of the pixel units 40 includes the pixel circuit 10 illustrated in FIG. 3.

For example, the scan signal line $G_N$ of the Nth row is connected with the data writing circuit and the compensation circuit which are in the pixel circuit 10 of the Nth row to provide the scan signal GATE; the data signal line $D_M$ of the Mth column is connected with the data writing circuit in the pixel circuit 10 of the Mth column to provide the data signal DATA; the scan signal line $G_{N-1}$ of the (N-1)th row is connected with the first reset circuit in the pixel circuit 10 of the Nth row, and the scan signal input by the scan signal line $G_{N-1}$ of the (N-1)th row serves as the first reset signal RST1 and is provided to the first reset circuit; the light emission control line $E_{N+1}$ of the (N+1)th row is connected with the first light emission control circuit in the pixel circuit 10 of the Nth row to provide the first light emission control signal EM1.

For example, in the case where the pixel circuit 10 includes the second light emission control circuit and the second reset circuit, the light emission control line $E_N$ of the Nth row is connected with the second light emission control circuit in the pixel circuit 10 of the Nth row to provide the second light emission control signal EM2; the scan signal line $G_{N+1}$ of the (N+1)th row is connected with the second reset circuit in the pixel circuit 10 of the Nth row, and the scan signal input by the scan signal line $G_{N+1}$ of the (N+1)th row serves as the second reset signal RST2 and is provided to the second reset circuit.

As described above, in the display device 1 provided in this embodiment, the pixel circuit 10 of each row is connected with the scan signal line of the present row in which the pixel circuit 10 is located, and also connected with the scan signal line of the previous row adjacent to the present row, so that the scan signal GATE provided by the scan signal line of the previous row is used as the first reset signal RST1 of the pixel circuit of the present row; at the same time, the pixel circuit 10 is also connected with the scan signal line of the next row adjacent to the present row, so that the scan signal GATE provided by the scan signal line of the next row is used as the second reset signal RST2 of the pixel circuit of the present row.

At the same time, the pixel circuit 10 of each row is connected with the light emission control line of the present row and connected with the light emission control line of the next row adjacent to the present row, so that the signal provided by the light emission control line of the next row is used as the first light emission control signal EM1 of the pixel circuit of the present row.

In the display device 1 provided in this embodiment, the development layout can be simplified by adopting the above-described arrangement. Other technical effects may be referred to the technical effects of the pixel circuit provided in the embodiments of the present disclosure and are not be repeated here.

Figure 11:
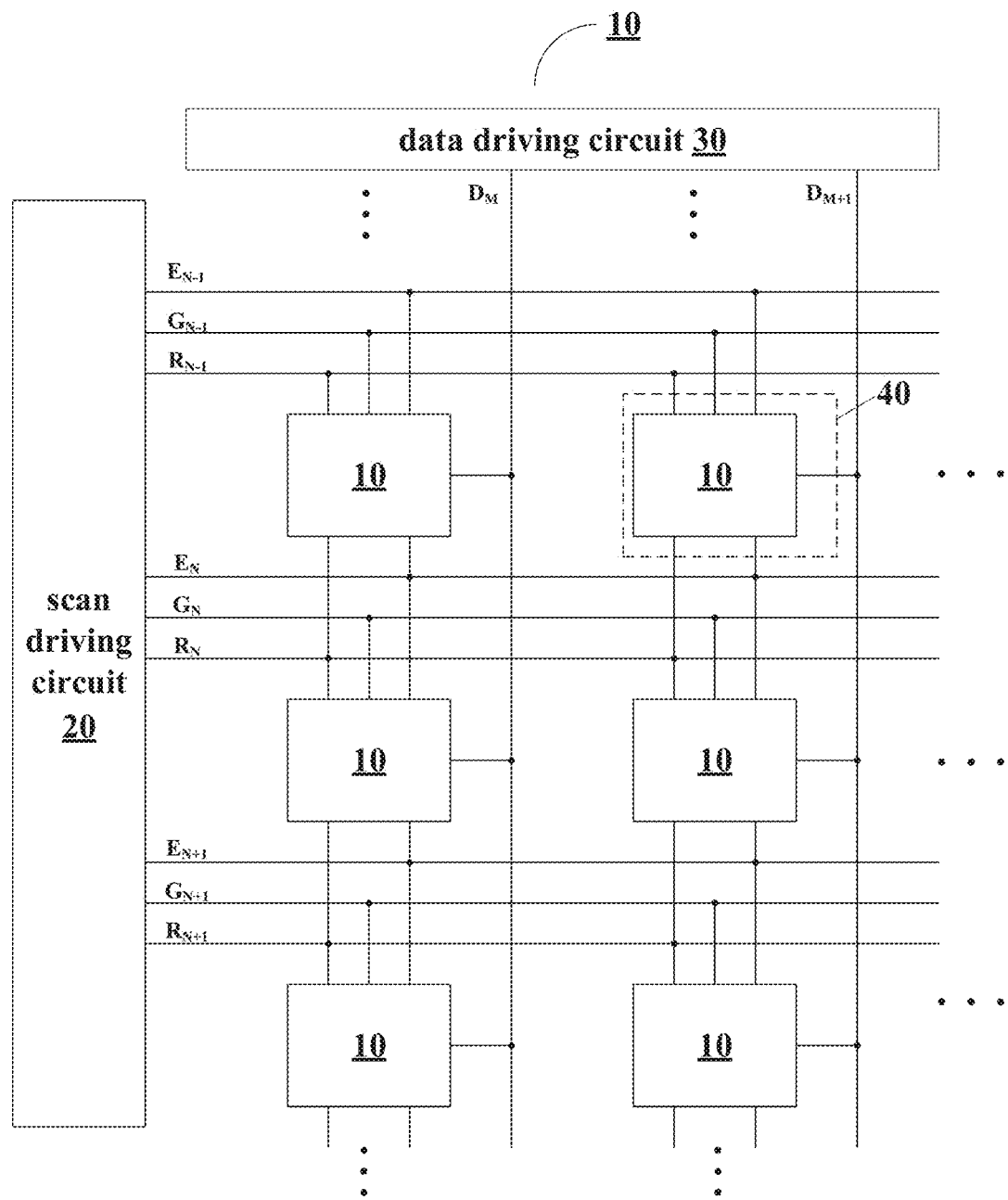
FIG. 11 is another schematic diagram of the display device provided by an embodiment of the present disclosure.

Another embodiment of the present disclosure further provides the display device 1. As illustrated in FIG. 11, the display device 1 provided in this embodiment differs from the display device illustrated in FIG. 10 in that the display device 1 further includes a plurality of reset control lines ($R_{N-1}$, $R_N$, $R_{N+1}$, etc.), only a part of the reset control lines are illustrated in FIG. 11, and the embodiment of the present disclosure includes but is not limited to this. For example, $R_{N-1}$ represents the reset control line of the (N-1) the row, $R_N$ represents the reset control line of the Nth row, and $R_{N+1}$ represents the reset control line of the (N+1)th row. In the display device 1 provided in this embodiment, the first reset signal RST1 and the second reset signal RST2 in the pixel circuit 10 of each row are no longer provided by the scan signal lines of adjacent rows, but are provided by the reset control lines.

For example, as illustrated in FIG. 11, in this embodiment, the pixel circuit 10 of each row is only connected with the scan signal line of the present row where the pixel circuit 10 is located, and is no longer connected with the scan signal line of the row adjacent to the present row. At the same time, the pixel circuit 10 of each row is connected with two reset control lines, for example, the reset control line $R_{N-1}$ of the (N-1)th row is connected with the first reset circuit of the pixel circuit 10 of the (N-1)th row to provide the first reset signal RST1, and the reset control line $R_N$ of the Nth row is connected with the second reset circuit of the pixel circuit 10 of the (N-1)th row to provide the second reset signal RST2. Similarly, the reset control line $R_N$ of the Nth row is connected with the first reset circuit in the pixel circuit 10 of the Nth row to provide the first reset signal RST1, and the reset control line RNA of the (N+1)th row is connected with the second reset circuit in the pixel circuit 10 of the Nth row to provide the second reset signal RST2. That is, the pixel circuit 10 of each row is connected with the reset control line of the present row where the pixel circuit 10 is located and the reset control line of the next row.

Other parts and technical effects of this embodiment can be referred to the corresponding description in the embodiment provided in FIG. 10, and is not repeated here.

It should be noted that the display device 1 illustrated in FIG. 10 and FIG. 11 may further include a plurality of first voltage lines and a plurality of reset voltage lines to respectively provide the first voltage VDD and the reset voltage VINT (not illustrated in the figure).

For example, as illustrated in FIG. 10 and FIG. 11, the display device 1 may further include a scan driving circuit 20 and a data driving circuit 30.

For example, the data driving circuit 30 is connected with the plurality of data signal lines ($D_M$, $D_{M+1}$, etc.) to provide the data signal DATA; at the same time, the data driving circuit 30 may also be connected with a plurality of first voltage lines (not illustrated) and a plurality of reset voltage lines (not illustrated) to respectively provide the first voltage VDD and the reset voltage VINT.

For example, the scan driving circuit 20 is connected with the plurality of scan signal lines ($G_{N-1}$, $G_N$, $G_{N+1}$, etc.) to provide the scan signal GATE, and the scan driving circuit 20 is connected with the plurality of light emission control lines ($E_{N-1}$, $E_N$, $E_{N+1}$, etc.) to provide the light emission control signal; in the case where the display device 1 includes the plurality of reset control lines (as illustrated in FIG. 11), the scan driving circuit 20 may also be connected with the plurality of reset control lines ($R_{N-1}$, $R_N$, $R_{N+1}$, etc.) to provide the reset signal.

For example, the scan driving circuit 20 and the data driving circuit 30 may be implemented as semiconductor chips. The display device 1 may also include other components, such as a timing controller, a signal decoding circuit, a voltage conversion circuit, etc. These components may, for example, adopt existing conventional components and are not be described in detail here.

For example, the display device 1 provided by the embodiments of the present disclosure may be any product or component with a display function, such as electronic paper, mobile phone, tablet computer, television, display, notebook computer, digital photo frame, navigator, and so on.

At least one embodiment of the present disclosure further provides a driving method that can be used to drive the pixel circuit 10 provided by the embodiments of the present disclosure and the display device 1 adopting the pixel circuit 10. For example, the driving method includes the following operations.

In the initialization stage, the first reset signal RST1 is input, the first reset circuit 400 is turned on, and the reset voltage VINT is applied to the control terminal 110 of the driving circuit 100; the first light emission control signal EM1 is input, the first light emission control circuit 500 is turned on, and the first voltage VDD is applied to the first terminal 120 of the driving circuit 100, so that the driving circuit 100 is in a fixed bias state, for example, in an on state of the fixed bias.

In the data writing and compensation stage, the scan signal GATE and the data signal DATA are input, and the data writing circuit 200, the driving circuit 100 and the compensation circuit 300 are turned on; the data writing circuit 200 writes the data signal DATA into the driving circuit 100, and the compensation circuit 300 compensates the driving circuit 100.

In the reset stage, the second light emission control signal EM2 and the second reset signal RST2 are input, the second light emission control circuit 700 and the second reset circuit 800 are turned on, and the driving circuit 100, the compensation circuit 300 and the light emitter element 600 are reset.

In the light emission stage, the first light emission control signal EM1 and the second light emission control signal EM2 are input, the first light emission control circuit 500, the second light emission control circuit 700 and the driving circuit 100 are turned on, and thus the second light emission control circuit 700 applies the driving current to the light emitter element 600 to drive the light emitter element 600 to emit light.

It should be noted that the detailed description of the driving method can be referred to the description of the working principle of the pixel circuit 10 in the embodiments of the present disclosure, and is not repeated here.

The driving method provided by the embodiments of the present disclosure can inhibit the phenomenon of short-term residual image that may occur because of the lag effect.

At least one embodiment of the present disclosure further provides a display substrate, the display substrate includes a base substrate provided with a sub-pixel, the sub-pixel includes a pixel circuit, and the pixel circuit includes: a driving circuit, a data writing circuit, a first reset circuit, a first light emission control circuit, a second light emission control circuit, a light emitter element, a first light emission control line and a second light emission control line; the driving circuit includes a control terminal, a first terminal and a second terminal, and is configured to control a driving current flowing through the first terminal and the second terminal for driving the light emitter element to emit light; the data writing circuit is configured to write a data signal to the driving circuit in response to a scan signal; the first light emission control circuit is configured to apply a first voltage to a first terminal of the driving circuit in response to a first light emission control signal; the second light emission control circuit is configured to apply the driving current to the light emitter element in response to a second light emission control signal; the first reset circuit is configured to apply a first reset voltage to the control terminal of the driving circuit in response to a first reset signal, and the first reset signal and the first light emission control signal are simultaneously turn-on signals during at least a period of time; the first light emission control line and the second light emission control line respectively substantially extend along a first direction and are arranged in a second direction, and the second direction intersects with the first direction.

Figure 12:
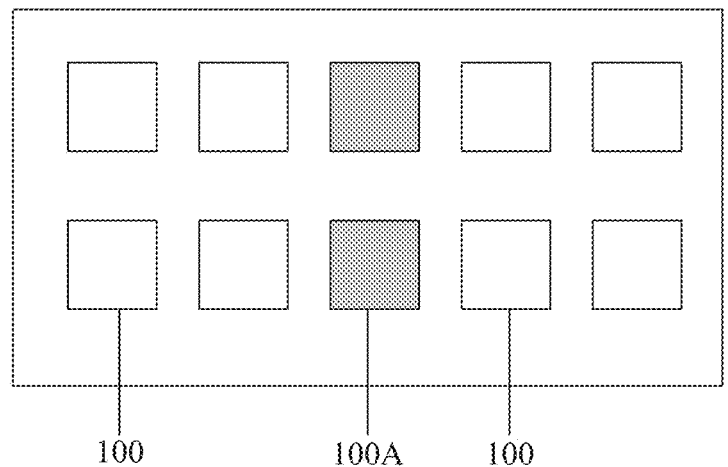
FIG. 12 is a schematic diagram of a display substrate provided by an embodiment of the present disclosure.

As shown in FIG. 12, for example, the display substrate 10 provide by at least one embodiment of the present disclosure includes a plurality of pixels 100 arranged in an array, at least some of the pixels 100 include a plurality of sub-pixels, and at least some of the sub-pixels include the light emitter element and the pixel circuit that drive the light emitter element to emit light. For example, the pixel circuit includes a 2T1C (i.e., two transistors and one capacitor) pixel circuit, a 4T2C, 5T1C, 7T1C or nTmC (n and m are positive integers) pixel circuit. For example, in different embodiments, the pixel circuit may further include a compensation circuit which includes an internal compensation circuit or an external compensation circuit, and the compensation circuit may include a transistor, a capacitor, and the like. For example, the pixel circuit further includes a reset circuit (for example, the first reset circuit or the second reset circuit that are mentioned above), a light emission control circuit, a detection circuit, etc., as required.

For example, as shown in FIG. 12, a plurality of pixels 100 are located in the display region. For example, in the display substrate 1000 provided by some embodiments, some of the plurality of pixels 100 are dummy pixels 100A, and the dummy pixels 100A do not participate in the display work, and each dummy pixel) 100A includes a plurality of dummy sub-pixels but does not include sub-pixels that play a display driving role.

For example, the display substrate 1000 is an organic light emitter diode (OLED) display substrate, and the light emitter device is an OLED. The display substrate 100 may further include a plurality of scan lines and a plurality of data lines for providing scan signals (control signals) and data signals for the plurality of sub-pixels so as to drive the plurality of sub-pixels. According to needs, the display substrate 100 may further include power lines, detection lines, and the like.

Figure 13A:
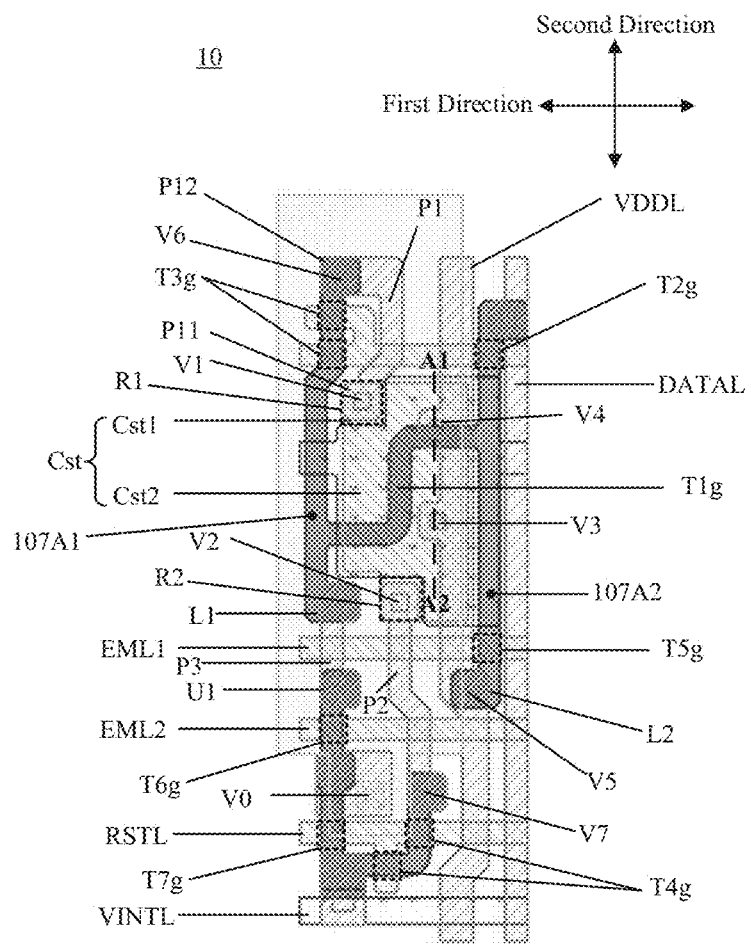
FIG. 13A is a structural diagram of a sub-pixel of the display substrate provided by an embodiment of the present disclosure.

Exemplarily, FIG. 13A is a structural diagram of a sub-pixel of the display substrate provided by an embodiment of the present disclosure; FIG. 13B-13L are schematic planar views of the semiconductor layer, the first conductive layer, the second conductive layer, the second insulation layer, the third insulation layer, and the third conductive layer that are stacked in the display substrate shown in FIG. 13A; and FIG. 14 is a sectional view along the line A1-A2 in FIG. 13A.

Referring to FIGS. 2-3, FIG. 13A and FIG. 14, the display substrate 100 includes a base substrate 200 provided with a sub-pixel 10, the sub-pixel 10 includes a pixel circuit, and the pixel circuit 10 includes: a driving circuit 100, a data writing circuit 200, a first reset circuit 400, a first light emission control circuit 500, a second light emission control circuit 700, a light emitter element D1, a first light emission control line EML1 and a second light emission control line EML2; for example, the pixel circuit 10 is the pixel circuit described in the above embodiments. The driving circuit 100 includes a control terminal 110, a first terminal 120 and a second terminal 130, and is configured to control a driving current flowing through the first terminal 120 and the second terminal 130 for driving the light emitter element D1 to emit light; the data writing circuit 200 is configured to write a data signal DATA to the driving circuit 100 in response to a scan signal GATE; the first light emission control circuit 500 is configured to apply a first voltage VDD to the first terminal 120 of the driving circuit 100 in response to a first light emission control signal EM1; the second light emission control circuit 700 is configured to apply the driving current to the light emitter element D1 in response to a second light emission control signal EM2; the first reset circuit 400 is configured to apply a first reset voltage VINT to the control terminal 110 of the driving circuit 100 in response to a first reset signal RST1, and the first reset signal RST1 and the first light emission control signal EM1 are simultaneously turn-on signals during at least a period of time; the first light emission control line EML1 and the second light emission control line EML2 respectively substantially extend along a first direction D1 and are arranged in a second direction D2, and the second direction D2 intersects with the first direction D1. In the display substrate provided by the embodiments of the present disclosure, each pixel circuit of each sub-pixel has two light emission control lines, namely the first light emission control line EML1 and the second light emission control line EML2, so different light emission control signals are respectively applied to the two light emission control lines, which can realize an effective way of transmit the first light emission control signal EM1 and the second light emission control signal EM2 that are different with each other, so that a flexible signal control mode is realized.

For example, as the embodiment illustrated in FIG. 13A, the second direction D2 is perpendicular to the first direction D1, which is not limited to this case.

For example, the display substrate 100 comprises a plurality of light emission control lines and a plurality of the sub-pixels 10 distributed in an array; the plurality of light emission control lines comprise the first light emission control line EML1 and the second light emission control line EML2; the array comprises a plurality of sub-pixel rows, each sub-pixel row of the plurality of sub-pixel rows comprises the sub-pixels, a first sub-pixel row corresponds to a first one of the plurality of light emission control lines, . . . , an Nth sub-pixel row corresponds to an Nth one of the plurality of light emission control lines, and an (N+1)th sub-pixel row corresponds to an (N+1)th one of the plurality of light emission control lines, and N is an integer greater than 0; The display substrate comprises: a display region, a non-display region at least partially surrounding the display region, and a peripheral circuit which is in the non-display region and is configured to provide a light emission control signal to the plurality of light emission control line; the light emission control signal is sequentially provided from the first one of the plurality of light emission control lines to the (N+1)th one of the plurality of light emission control lines.

For example, in some embodiments, as illustrated in FIG. 4, the first light emission control line EML1 in the pixel circuit of the Nth sub-pixel row is the (N+1)th one of the plurality of light emission control lines; and the second light emission control line EML2 in the pixel circuit 10 of the Nth sub-pixel row is the Nth one of the plurality of light emission control lines, so that the first light emission control signal EM1 applied to the first light emission control line EML1 is delayed for a design time period compared with the second light emission control signal EM2 applied to second light emission control line EML2.

For example, in some other embodiments, the first light emission control line EML1 in the pixel circuit of the Nth sub-pixel row is the Nth one of the plurality of light emission control lines; and the second light emission control line EML2 in the pixel circuit of the Nth sub-pixel row is the (N+1)th one of the plurality of light emission control lines. In this way, the second light emission control signal EM2 applied to second light emission control line EML2 is delayed for a design time period compared with the first light emission control signal EM1 applied to the first light emission control line EML1.

With reference to FIGS. 13B-13G and 14, the display substrate 100 includes a semiconductor layer 107, a first insulation layer 301, a first conductive layer 201, a second insulation layer 302, a second conductive layer 202, a third insulation layer 303, a third conductive layer 203, a fourth insulation layer 304 and a fourth conductive layer 204 which are sequentially disposed on the base substrate 200.

Figure 13B:
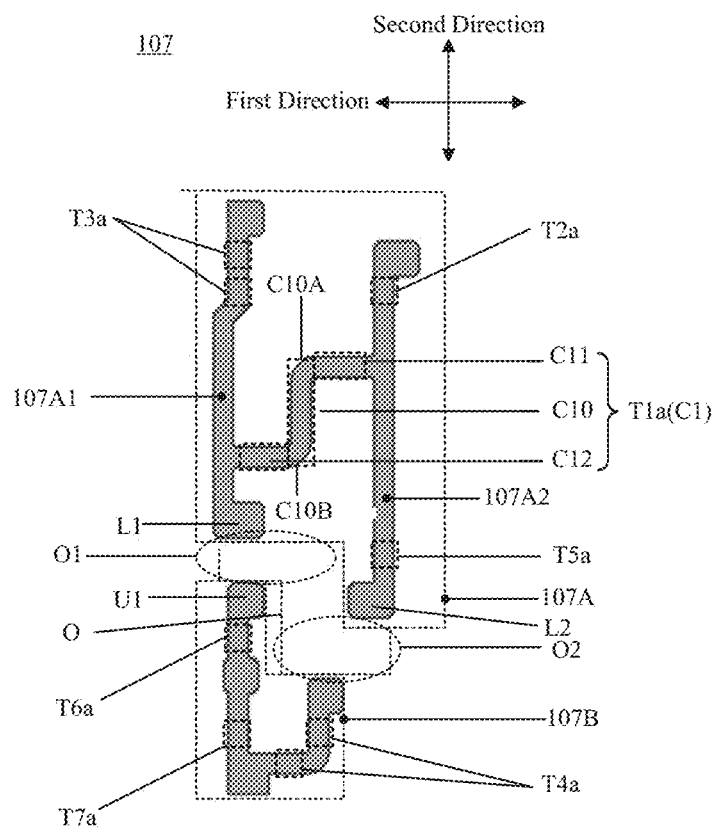
FIG. 13B is a schematic planar view of a semiconductor layer in the display substrate shown in FIG. 13A.
Figure 14:
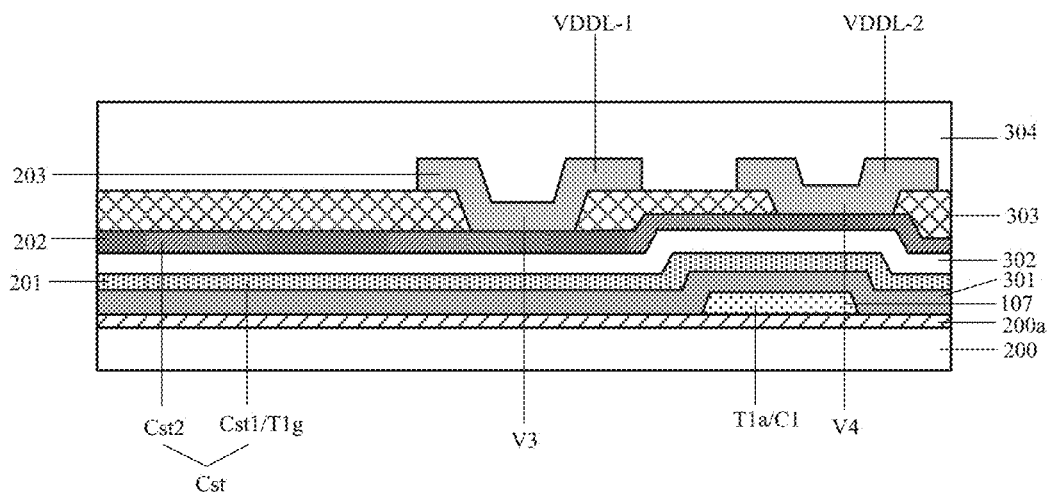
FIG. 14 is a sectional view along the line A1-A2 in FIG. 13A.

For example, as shown in FIG. 13B, the semiconductor layer 107 includes active patterns T1a-T7a of the first to the seventh transistors T1-T7. As shown in FIG. 13B, the active patterns T1a-T7a of the first to the seventh transistors T1-T7 are connected to each other and constitute an integrated structure. For example, the semiconductor layer 107 in each row of sub-pixels have an integrated structure connected with each other, and the semiconductor layers 107 in adjacent two rows of sub-pixels are spaced apart from each other. In FIG. 13B, the active patterns T1a-T7a of the first to seventh transistors T1-T7 in one pixel circuit 10 are shown by small dashed line boxes.

Figure 13C:
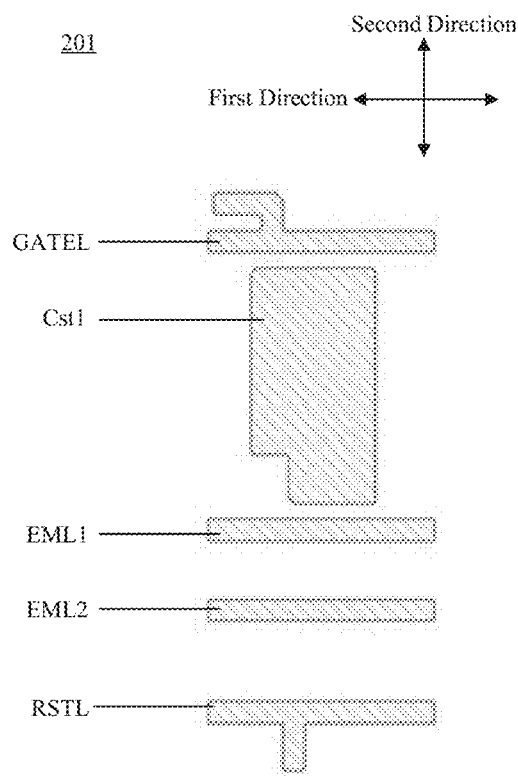
FIG. 13C is a schematic planar view of a first conductive layer in the display substrate shown in FIG. 13A.
Figure 13D:
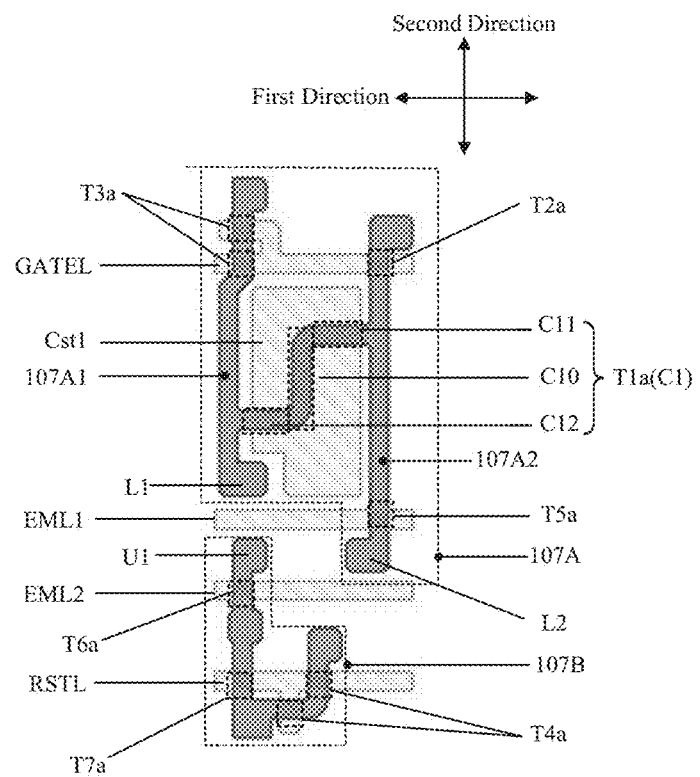
FIG. 13D is a schematic planar view of the semiconductor layer and the first conductive layer that are stacked in the display substrate shown in FIG. 13A.

For example, as shown in FIGS. 13C-13D, the first conductive layer 201 includes the gate electrode of each transistor and some scan lines and control lines. In FIG. 13A, the gate electrodes T1g-T7g of the first to seventh transistors T1-T7 in one pixel circuit 10 are shown by small dashed line boxes. For example, as illustrated in FIGS. 13C-13D, the first conductive layer 201 includes gates T1g-T7g of first to seventh transistors T1-T7.

For example, as shown in FIGS. 13C-13D, the first conductive layer 201 further includes a plurality of gate lines insulated from each other, including a plurality of scan lines GATEL, a plurality of reset control lines RSTL and a plurality of light emission control lines EML1/EML2. Here, the gate line refers to a signal line directly connected with the gate electrode of the transistor to provide a scan signal or a control signal. For example, each sub-pixel row is correspondingly connected with one scan line GATEL, two reset control lines which are respectively a first reset control line and a second reset control line, and two light emission control line which are respectively the first light emission control line EML1 and the second light emission control signal EM2. For example, the gate electrode T4g of the fourth transistor T6 of the pixel circuit 10 of this sub-pixel row is electrically connected with the first reset control line (not shown in figures) corresponding to this row to receive the first reset control signal RST1; the gate electrode of the seventh transistor T7 of the pixel circuit 10 of the current sub-pixel row is electrically connected with the second reset control line RSTL (as shown in FIG. 13A and FIG. 13F) corresponding to the pixel circuit 10 of the next sub-pixel row (i.e., the sub-pixel row where the scan lines are sequentially turned on after the scan line of the current row according to the scan order of the scan lines) to receive the second reset control signal RST2.

For example, as illustrated in FIG. 13A, FIGS. 13C-13F, and FIG. 14, the driving circuit 100 comprises a first transistor T1; a gate electrode of the first transistor T1 serves as the control terminal 110 of the driving circuit 100 to connect the first node N1, a first electrode of the first transistor T1 serves as the first terminal of the driving circuit 100 to connect the second node N2, and a second electrode of the first transistor T1 serves as the second terminal of the driving circuit 100 to connect the third node N3; the pixel circuit 10 further comprises a storage capacitor Cst which comprises a first electrode plate Cst1 and a second electrode plate Cst2, the first electrode plate Cst1 is electrically connected with the gate electrode of the first transistor T1, and the first light emission control line EML1 and the second light emission control line EML2 are arranged in a same layer as the first electrode plate Cst1. For example, the second electrode plate Cst2 is located in the second conductive layer 202 which is located on a side of the first conductive layer 201 away from the substrate 200, and the second insulation layer 302 is between the second conductive layer 202 and the first conductive layer 201, so that the space of one sub-pixel is properly and sufficiently utilized and saved, this is beneficial to increase the density of the sub-pixels and improve the PPI (pixels per inch) of a display device adopting the display substrate provided by the embodiments of the present disclosure.

For example, as illustrated in FIG. 13A, FIGS. 13D-13F, the first reset circuit 400 comprises a reset control line RSTL extending along the first direction, and the reset control line RSTL is connected with a first reset voltage terminal to provide the first reset signal RST1; the first light emission control line EML1, the second light emission control line EML2 and the reset control line RSTL are sequentially arranged in the second direction D2 and are all at a same side of the storage capacitor Cst in the second direction D2, so that the space of one sub-pixel is properly and sufficiently utilized and saved.

For example, as illustrated in FIG. 13A and FIG. 13D, the first light emission control line EML1 and the second light emission control line EML2 are at a side of the reset control line RSTL close to the storage capacitor Cst.

The features of the position relationship of the first light emission control line EML1, the second light emission control line EML2, the reset control line RSTL and the storage capacitor Cst refers to that, in the array of the display substrate, there are a plurality of sub-pixels and a plurality of pixel circuit, for the pixel circuit of one sub-pixel, the first light emission control line EML1, the second light emission control line EML2 and the reset control line RSTL are all at the same side of the storage capacitor Cst in the second direction D2; and for the pixel circuit of one sub-pixel, for example, the first light emission control line EML1 and the second light emission control line EML2 are at the side of the reset control line RSTL close to the storage capacitor Cst.

For example, as illustrated in FIGS. 13A-13B, the first transistor T1 comprises an active pattern T1a and a gate electrode T1g, the active pattern T1a of the first transistor T1 includes a channel region C1, and an orthographic projection of the channel region C1 of the first transistor T1 on the base substrate 200 overlaps with at least a part of an orthographic projection of the gate electrode T1g of the first transistor T1 on the base substrate 200; the channel region C1 of the first transistor T1 comprises a first transverse portion C11, a longitudinal portion C10 and a second transverse portion C12 which are sequentially arranged in the first direction D1; the first transverse portion C11 and the second transverse portion C12 respectively extend along the first direction D1 and the longitudinal portion C10 extends along the second direction D2; a first end C10A of the longitudinal portion C10 in the second direction D2 is connected with the first transverse portion C11, and a second end C10B of the longitudinal portion opposite to the first end C10A of the longitudinal portion C10 in the second direction D2 is connected with the second transverse portion C12. The planar shape constituted by the first transverse portion C11, the longitudinal portion C10 and the second transverse portion C12 can increase the area of the channel region C1 of the first transistor T1 and save space at the same time.

It should noted that the semiconductor layer 107 of the pixel circuit 10 includes the active pattern of the first transistor T1; the active pattern of the transistor includes the channel region of the transistor and the conductive portion of the semiconductor layer 107 at two sides of the channel region, the conductive portion includes the drain region and the source region which can be referred to the common technique in the art.

For example, as illustrated in FIG. 13A and FIGS. 13H-13J, the pixel circuit 10 further includes a first connection structure P1 and a second connection structure P2. The first connection structure P1 is in a same layer as the first electrode of the first transistor T1 and has a first end P11 and a second end P12, and the first end P11 of the first connection structure P1 is electrically connected with the first electrode plate Cst1 through a first via hole V1, and the second end P12 of the first connection structure P1 is electrically connected with the semiconductor layer 107, for example, through a sixth via hole V6. The second connection structure P2 is in a same layer as the first electrode of the first transistor T1, for example, is in the third conductive layer 203; and the second connection structure P2 has a first end P21 and a second end P22, the first end P21 of the second connection structure The second connection structure P2 is electrically connected with the first electrode plate Cst1 through a second via hole V2, and the second end P22 of the second connection structure P2 is electrically connected with the semiconductor layer 107, for example, through a seventh via hole V7.

Figure 13E:
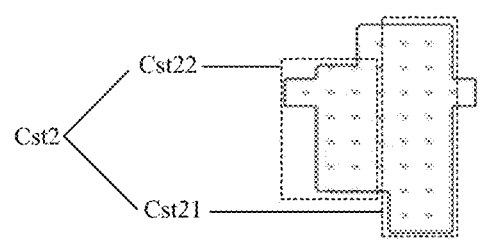
FIG. 13E is a schematic planar view of a second conductive layer in the display substrate shown in FIG. 13A.
Figure 13F:
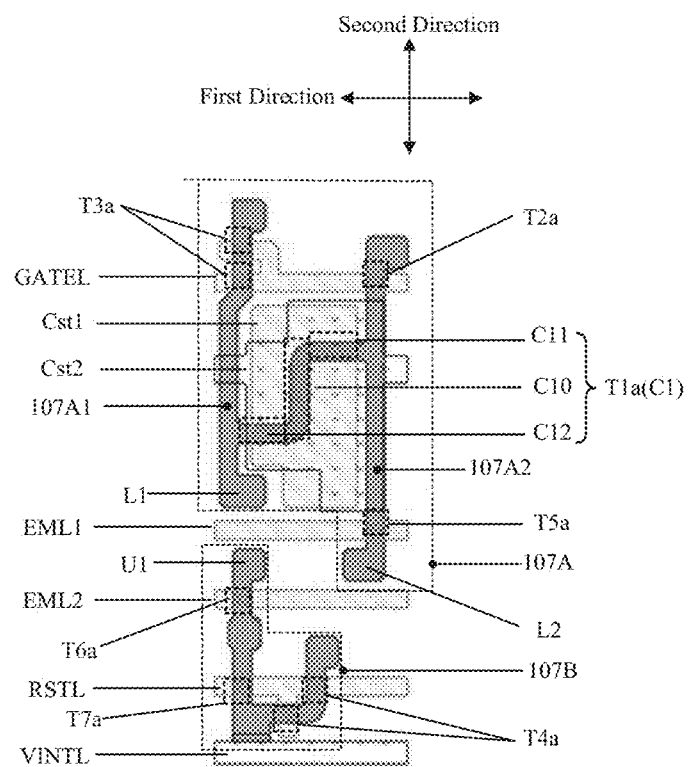
FIG. 13F is a schematic planar view of the semiconductor layer, the first conductive layer and the second conductive layer that are stacked in the display substrate shown in FIG. 13A.
Figure 13G:
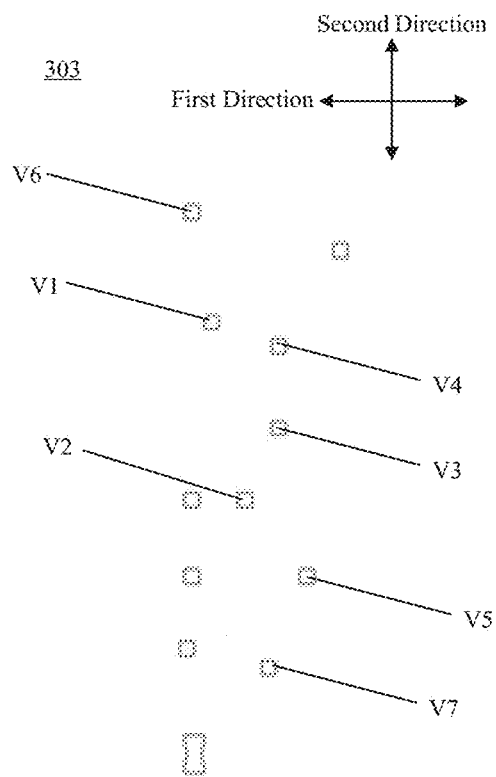
FIG. 13G is a schematic planar view of a second insulation layer and a third insulation layer in the display substrate shown in FIG. 13A.
Figure 13H:
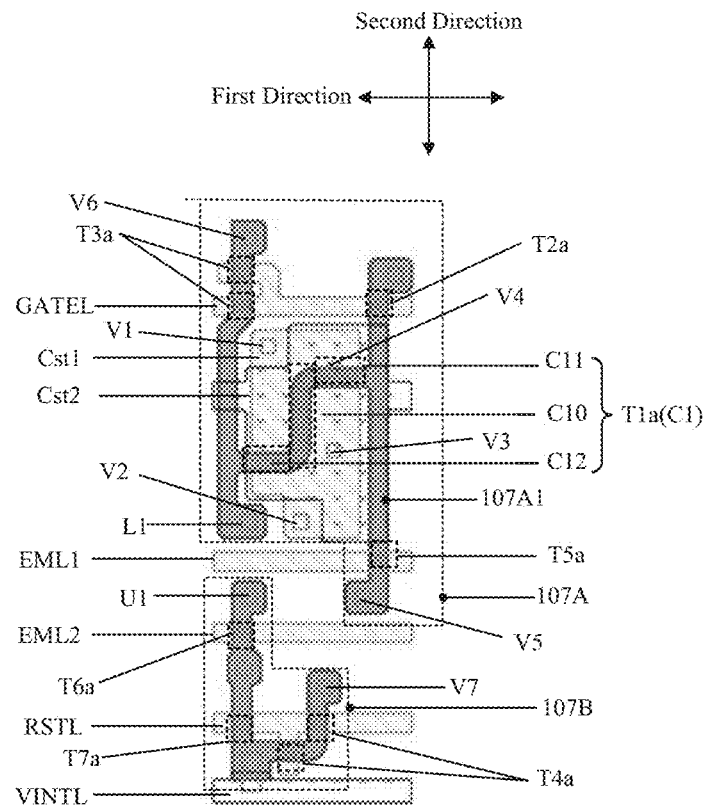
FIG. 13H is a schematic planar view of the semiconductor layer, the first conductive layer, the second conductive layer, the second insulation layer, and the third insulation layer that are stacked in the display substrate shown in FIG. 13A.

For example, as illustrated in FIG. 13A and FIG. 13H, the first via hole V1 is at a first end of the first electrode plate Cst1 in the second direction D2, and the second via hole V2 is at a second end of the first electrode plate Cst1 opposite to the second end of the first electrode plate Cst1 in the second direction D2; the first connection structure P1 is at a first side of the first electrode plate Cst1 in the second direction D2, and the second connection structure P2 is at a second side of the first electrode plate Cst1 opposite to the first side of the first electrode plate Cst1 in the second direction D2. In this way, it is convenient for the first connection structure P1 and the second connection structure P2 to be connected with the first electrode plate Cst1 and is beneficial to saving space.

For example, as illustrated in FIG. 13A, an orthographic projection of the first via hole V1 on the first electrode plate Cst1 is in a first region R1, and an orthographic projection of the second via hole V2 on the first electrode plate Cst1 is in a second region R2; an orthographic projection of the second electrode plate Cst2 on a plane where the first electrode plate Cst1 is located does not overlap with both the first region R1 and the second region R2, which can prevent the first via hole V1 and the second via hole V2 from passing through the second electrode plate Cst2, thus the difficulty of the manufacturing method of the display substrate is reduced, so that the yield rate is improved.

For example, as illustrated in FIG. 13E, the second electrode plate Cst2 includes a body portion Cst21 and a protrusion portion Cst22; the body portion Cst21 extends along the second direction D2, the protrusion portion Cst22 is connected with the body portion Cst21 protrudes from the body portion Cst21 along the first direction D1 and is at a first side of the body portion in the first direction D1, and a size of the protrusion portion Cst22 in the second direction D2 is smaller than that of the body portion Cst21 in the second direction D2, both the first region R1 and the second region R2 are at the first side of the body portion Cst21, the first region Rr1 is at a first side of the protrusion portion Cst22 in the second direction D2, and the second region R2 is at a second side of the protrusion portion Cst22 opposite to the first side of the protrusion portion Cst22 in the second direction D2.

Figure 13I:
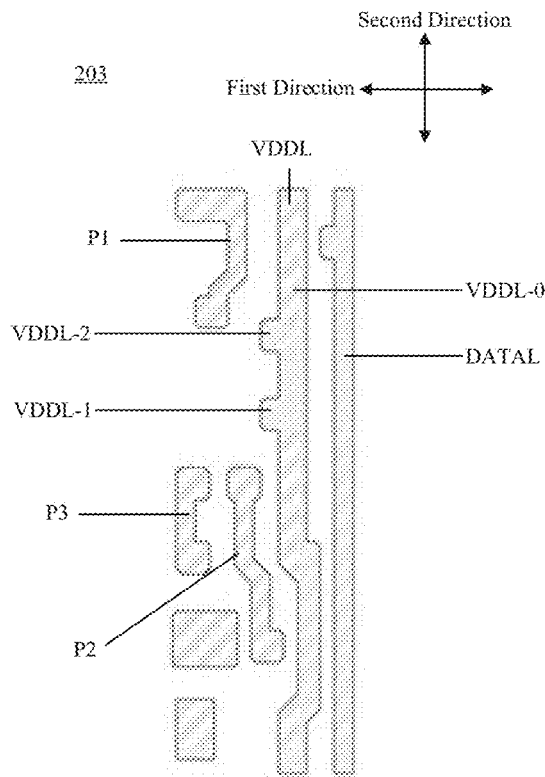
FIG. 13I is a schematic planar view of a third conductive layer in the display substrate shown in FIG. 13A.
Figure 13J:
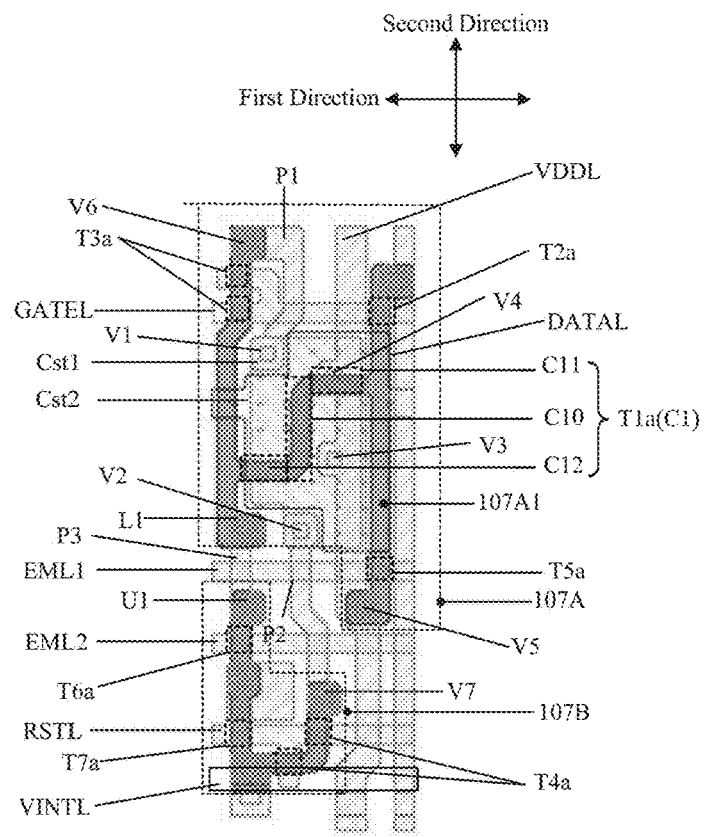
FIG. 13J is a schematic planar view of the semiconductor layer, the first conductive layer, the second conductive layer, the second insulation layer, the third insulation layer, and the third conductive layer that are stacked in the display substrate shown in FIG. 13A.

For example, as illustrated in FIG. 13E and FIGS. 13I-13J, the pixel circuit 10 further includes a first power supply line VDDL which is connected to the first voltage terminal mentioned above and is configured to provide the first voltage VDD to the pixel circuit 10, and is in a same layer as the first electrode of the first transistor T1, for example, is in the third conductive layer 203; combining FIG. 14, the first power supply line VDDL is electrically connected with the second electrode plate Cst2 at least through a third via hole V3 and a fourth via hole V4. The first power supply line VDDL is electrically connected with the second electrode plate Cst2 through at least two via holes can improve the reliability of the connection of the first power supply line VDDL and the second electrode plate Cst2.

For example, referring to FIG. 13I, the first power supply line VDDL includes a body line VDDL-0 extending along the second direction D2 and at least two protrusion portions including a first protrusion portion VDDL-1 and a second protrusion portion VDDL-2, an orthographic projection of the third via hole V3 on the base substrate 200 is within an orthographic projection of the first protrusion portion VDDL-1 and an orthographic projection of the fourth via hole V4 on the base substrate 200 is within an orthographic projection of the second protrusion portion VDDL-2, which can sufficiently utilize the space of the sub-pixel and realize the connection of the first power supply line VDDL and the second electrode plate Cst2.

For example, the compensation circuit 300 is configured to store the written data signal and compensate the driving circuit 100 in response to the scan signal GATE; a second reset circuit 800 is configured to apply the reset voltage VINT to the second terminal 130 of the driving circuit 100 in response to the second reset signal RST2, and the second reset signal RST2 is different from the first reset signal RST1.

For example, in the pixel circuit of the display substrate 1000, the data writing circuit 200 includes a second transistor T2, the gate electrode T2g of the second transistor T2 is connected to a scan signal terminal to receive the scan signal GATE, a first electrode of the second transistor T2 is connected to a data signal terminal to receive the data signal DATA, and a second electrode of the second transistor T2 is connected to the second node N2.

For example, the compensation circuit 300 includes a third transistor T3 and the storage capacitor Cst, a gate electrode of the third transistor T3 is configured to be connected with a scan signal GATE terminal to receive the scan signal GATE, a first electrode of the third transistor T3 is connected with the third node N3, a second electrode of the third transistor T3 is connected with the first electrode plate Cst1 of the storage capacitor Cst, and the second electrode plate Cst2 of the storage capacitor Cst is configured to be connected with a first voltage terminal; the first reset circuit 400 includes a fourth transistor T4, a gate electrode T4g of the fourth transistor T4 is connected to a first reset control terminal to receive the first reset signal RST1, a first electrode of the fourth transistor T4 is connected to the first node N1, and a second electrode of the fourth transistor T4 is connected to a reset voltage terminal to receive the reset voltage VINT.

For example, the first light emission control circuit 500 includes a fifth transistor T5, a gate electrode of the fifth transistor T5 is configured to be connected with a first light emission control terminal to receive the first light emission control signal EM1, a first electrode of the fifth transistor T5 is configured to be connected with the first voltage terminal to receive the first voltage VDD, and a second electrode of the fifth transistor T5 is connected with the second node N2.

The second light emission control circuit 700 includes a sixth transistor T6, a gate electrode of the sixth transistor T6 is configured to be connected with a second light emission control terminal to receive the second light emission control signal EM2, a first electrode of the sixth transistor T6 is connected with the third node N3, and a second electrode of the sixth transistor T6 is connected with the fourth node N4; a first electrode of the light emitter element is configured to be connected with the fourth node, and a second electrode of the light emitter element is configured to be connected with a second voltage terminal to receive a second voltage.

The second reset circuit 800 includes a seventh transistor T7, a gate electrode of the seventh transistor T7 is configured to be connected with a second reset control terminal to receive the second reset signal, a first electrode of the seventh transistor T7 is connected with the fourth node, and a second electrode of the seventh transistor T7 is configured to be connected with a reset voltage terminal to receive the reset voltage VINT.

For example, as illustrated in FIGS. 13A-13B, the semiconductor layer 107 includes a first portion 107A and a second portion 107B, and the first portion 107A of the semiconductor layer 107 is spaced apart from the second portion 107B of the semiconductor layer 107 by an opening O; a part of the first portion 107A of the semiconductor layer 107 constitutes the active pattern T1a of the first transistor T1, the active pattern T2a of the second transistor T2, the active pattern T3a of the third transistor T3, the active pattern T4a of the fourth transistor T4 and the active pattern T5a of the fifth transistor T5; a part of the second portion 107B of the semiconductor layer 107 constitutes the active pattern T6a of the sixth transistor T6 and the active pattern T7a of the seventh transistor T7.

For example, as illustrated in FIGS. 13A-13B, the opening O includes a first opening portion O1 and a second opening portion O2; an orthographic projection of the first opening portion O1 on the base substrate 200 overlaps with an orthographic projection of the first light emission control line EML1 on the base substrate 200 and does not overlap with an orthographic projection of the second light emission control line EML2 on the base substrate 200; and the second opening portion O2 is at a side of the first opening portion O1 away from the gate electrode T5g of the fifth transistor T5 in the first direction D1, and an orthographic projection of the second opening portion O2 on the base substrate 200 overlaps with the orthographic projection of the second light emission control line EML2 on the base substrate 200 and does not overlap with the orthographic projection of the first light emission control line EML1 on the base substrate 200. In this way, it can be avoided that the first light emission control line EML1 overlaps with the semiconductor layer 107 at the position of the first opening portion O1, and it can be avoided that the second light emission control line EML2 overlaps with the semiconductor layer 107 at the position of the second opening portion O2, thus to avoid forming gate electrodes at the positions of the first opening portion O1 and the second opening portion O2.

For example, as illustrated in FIG. 13A and FIG. 13I, the pixel circuit 10 further includes a third connection structure P3 electrically connected with the first portion 107A of the semiconductor layer 107 and the second portion 107B of the semiconductor layer 107.

For example, as illustrated in FIG. 13A and FIG. 13I, the first portion 107A of the semiconductor layer 107 has a lower end L1 close to the second portion 107B of the semiconductor layer 107 in the second direction D2, the second portion 107B of the semiconductor layer 107 has an upper end U1 close to the first portion 107A of the semiconductor layer 107 in the second direction D2, the lower end L1 of the first portion 107A of the semiconductor layer 107 and the upper end U1 of the second portion 107B of the semiconductor layer 107 are opposite to each other in the second direction D2, and the third connection structure P3 is connected with the lower end L1 of the first portion 107A of the semiconductor layer 107 and the upper end U1 of the second portion 107B of the semiconductor layer 107, which is beneficial to saving space.

For example, a distance between the lower end L1 and the upper end U1 is the smallest distance between the first portion 107A of the semiconductor layer 107 and the second portion 107B of the semiconductor layer 107, therefore, connecting the lower end L1 and the upper end U1 by the third connection structure P3 is a proper way to realize the connection of first portion 107A of the semiconductor layer 107 and the second portion 107B of the semiconductor layer 107, and can simplify the structure and the the manufacturing method of the display substrate 1000.

For example, as illustrated in FIG. 13A and FIG. 13I, the first portion 107A of the semiconductor layer 107 includes a first vertical portion 107A1 and a second vertical portion 107A2. The first vertical portion 107A1 substantially extends along the second direction D2 and includes the lower end L1; and the second vertical portion 107A2 substantially extends along the second direction D2 and is opposite to the first vertical portion 107A1 in the first direction D1, and the storage capacitor Cst1 is between the first vertical portion 107A1 and the second vertical portion 107A2; the second vertical portion 107A2 has lower end L2 close to the second portion 107B of the semiconductor layer 107 in the second direction D2, and the first power supply line VDDL is electrically connected with the lower end L2 of the second vertical portion 107A2 through a fifth via hole V5.

Figure 13K:
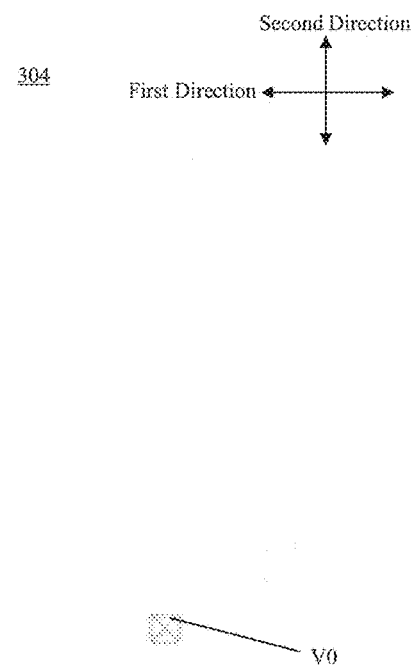
FIG. 13K is a schematic planar view of a fourth insulation layer in the display substrate shown in FIG. 13A.
Figure 13L:
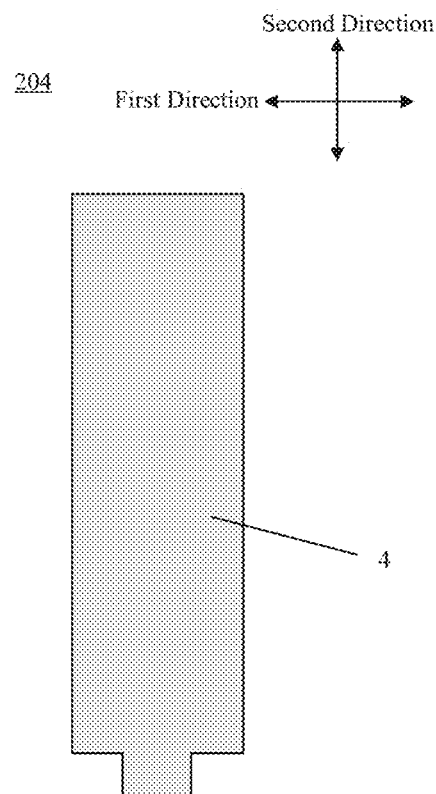
FIG. 13L is a schematic planar view of a first electrode of an light emitter element of the pixel circuit provided by at least one embodiment of the present disclosure.

For example, as shown in FIG. 13A and FIGS. 13K-13L, the light emitter element D1 of the sub-pixel includes a first electrode 4, a second electrode (not shown), and a light emitter layer (not shown) located between the first electrode 4 and the second electrode. The sub-pixel also includes a pixel definition layer (not shown) located on a side of the first electrode 4 of the light emitter element away from the base substrate 200, and an opening is formed in the pixel definition layer to expose at least a part of the first electrode 4 so as to define an opening area (i.e., a light emitter area) of each sub-pixel of the display substrate. The light emitter layer of the light emitter element D1 is formed at least in the opening area (the light emitter layer may also cover a part of the surface of the pixel definition layer away from the first electrode), and the second electrode is formed on the light emitter layer to form the light emitter element D1. For example, the second electrode is a common electrode, and the whole surface is arranged in the display substrate 100. For example, the first electrode 4 is the anode of the light emitter element D1, and the second electrode is the cathode of the light emitter element D1.

For example, the light emitter element D1 is a top emission structure, and the first electrode 4 is reflective and the second electrode is transmissive or semi-transmissive. For example, the first electrode 4 is made of a material with high work function to serve as an anode, such as an ITO/Ag/ITO laminated structure; The second electrode is a material with low work function to serve as a cathode, for example, a semi-transmissive metal or a metal alloy material, for example, an Ag/Mg alloy material. In one sub-pixel, the first electrode 4 is electrically connected to one selected from a group consisting of the first electrode of the driving transistor T1 and the second electrode of the driving transistor T1 through an electrode via hole V0 as shown in FIG. 13A and FIG. 13K. For example, as shown in FIGS. 3H-3I, a plurality of sub-pixels of the display substrate 100 include a first sub-pixel, two adjacent second sub-pixels and a third sub-pixel; the first sub-pixel, the second sub-pixel and the third sub-pixel respectively emit light of different colors, for example, respectively emit red light, green light and blue light. Of course, the embodiments of the present disclosure are not limited to this.

At least one embodiment of the present disclosure further provides a display device including the display substrate provided by the embodiments of the present disclosure. The specific features of the display device can be referred to those of the display device mentioned above.

What have been described above are only specific implementations of the present disclosure, the protection scope of the present disclosure is not limited thereto. The protection scope of the present disclosure should be based on the protection scope of the claims.

What is claimed is:

1. A display substrate comprising:
  a base substrate;
  a sub-pixel, provided on the base substrate and comprising a pixel circuit, wherein the pixel circuit comprises:
    a driving circuit, a first reset circuit, a first light emission control circuit, a first light emission control line, a scan line and a light emitter element,
  the driving circuit comprises a control terminal, a first terminal and a second terminal, the first light emission control circuit is configured to apply a first voltage to the first terminal of the driving circuit in response to a first light emission control signal provided by the first light emission control line; and
  a control terminal of the first reset circuit is connected to a first reset control terminal to receive a first reset signal, a first terminal of the first reset circuit is connected to the control terminal of the driving circuit, and a second terminal of the first reset circuit is connected to a reset voltage terminal to receive a first reset voltage;
  the pixel circuit further comprises a compensation circuit, the compensation circuit is electrically connected with the control terminal of the driving circuit and the second terminal of the driving circuit, and configured to store a data signal that is written in and compensate the driving circuit in response to a scan signal; the compensation circuit comprises a storage capacitor, a control terminal of the compensation circuit is connected with the scan line which is connected with a scan signal terminal to receive the scan signal, a first electrode plate of the storage capacitor is connected with the control terminal of the driving circuit, and a second electrode plate of the storage capacitor is connected with the first voltage terminal;
  the first light emission control line extends along a first direction, and a second direction intersects with the first direction;

the display substrate further comprises:
a second light emission control circuit, configured to apply the driving current to the light emitter element in response to a second light emission control signal; and
a second light emission control line, configured to provide the second light emission control signal, wherein
the first light emission control line and the second light emission control line extend along a same direction;
the first light emission control line and the second light emission control line are spaced apart from each other in the second direction; in the second direction, both an orthographic projection of the first light emission control line on the base substrate and an orthographic projection of the second light emission control line are at a first side of an orthographic projection of the first electrode plate of the storage capacitor on the base substrate, and an orthographic projection of the scan line on the base substrate is at a second side of the orthographic projection of the first electrode plate of the storage capacitor on the base substrate which is opposite to the first side.

2. The display substrate according to claim 1, wherein the first light emission control circuit comprises a first light emission control transistor, a gate electrode of the first light emission control transistor is connected with the first light emission control line to receive the first light emission control signal, a first electrode of the first light emission control transistor is connected with a first voltage terminal to receive a first voltage, and a second electrode of the first light emission control transistor is connected with the first terminal of the driving circuit;
at least part of an electrode in which an active layer of the first light emission control transistor is located extends along the second direction.

3. The display substrate according to claim 1, wherein the first reset circuit is configured to apply a first reset voltage to the control terminal of the driving circuit in response to a first reset signal, and the first reset signal and the first light emission control signal are simultaneously turn-on signals during at least a period of time.

4. The display substrate according to claim 1, wherein the compensation circuit further comprises a compensation transistor, a gate electrode of the compensation transistor is connected with the scan line to receive a scan signal, a first electrode of the compensation transistor is connected with the second terminal of the driving circuit, and a second electrode of the compensation transistor is connected with the first electrode plate of the storage capacitor;
the pixel circuit further comprises a first reset control line, the control terminal of the first reset circuit is connected to the first reset control line which is connected to the first reset control terminal to receive the first reset signal; and
in the second direction, a distance between the first reset control line and the first electrode plate of the storage capacitor is larger than a distance between the scan line and the first electrode plate of the storage capacitor.

5. The display substrate according to claim 4, wherein in the second direction, an orthographic projection of a channel region of the compensation transistor on the base substrate is on a side of an orthographic projection of a channel region of the driving circuit on the base substrate away from at least part of an orthographic projection of a channel region of the first light emission control circuit on the base substrate.

6. The display substrate according to claim 1, wherein the pixel circuit comprises a data writing circuit, the data writing circuit is configured to write a data signal to the driving circuit in response to the scan signal;
both orthographic projections of the first light emission control line and the second light emission control line on the base substrate are at a side of an orthographic projection of the driving circuit on the base substrate away from an orthographic projection of the data writing circuit on the base substrate.

7. The display substrate according to claim 4, wherein the pixel circuit further comprises a data writing circuit, the data writing circuit is configured to write a data signal to the driving circuit in response to the scan signal; the compensation transistor;
the data writing circuit comprises a data writing transistor, a gate electrode of the data writing transistor is connected to the scan signal terminal to receive the scan signal, a first electrode of the data writing transistor is connected to a data signal terminal to receive the data signal, and a second electrode of the data writing transistor is connected to the first terminal of the driving circuit;
part of the orthographic projection of the channel region of the compensation transistor on the base substrate is at a side of an orthographic projection of a channel region of the data writing transistor on the base substrate away from the orthographic projection of the driving circuit on the base substrate.

8. The display substrate according to claim 2, wherein the pixel circuit further comprises a second light emission control circuit, the second light emission control circuit is configured to apply the driving current to the light emitter element in response to a second light emission control signal, the second light emission control signal is different from the first light emission control signal, and the second light emission control circuit comprises a second light emission control transistor;
in the second direction, both an orthographic projection of the first light emission control transistor on the base substrate and an orthographic projection of the second light emission control transistor on the base substrate are on a side of an orthographic projection of a channel region of the driving circuit on the base substrate close to an orthographic projection of the light emitter element on the base substrate.

9. The display substrate according to claim 1, wherein the first light emission control line and the second light emission control line are arranged in a same layer as the first electrode plate of the storage capacitor.

10. The display substrate according to claim 2, wherein the orthographic projections of the first light emission control transistor and the second light emission control transistor on the base substrate are adjacent to an orthographic projection of the storage capacitor on the base substrate in the second direction.

11. The display substrate according to claim 1, wherein the pixel circuit further comprises a second reset circuit, configured to apply a second reset voltage to a first electrode of the light emitter element in response to a second reset signal, and the second reset circuit comprises a second reset transistor; and
the pixel circuit further comprises a second light emission control circuit, the second light emission control circuit is configured to apply the driving current to the light emitter element in response to a second light emission control signal, the second light emission control signal is different from the first light emission control signal, and the second light emission control circuit comprises a second light emission control transistor;

an electrode in which an active layer of the second reset transistor is located and an electrode in which an active layer of the second light emission control transistor is located constitute a continuous integral structure.

12. The display substrate according to claim 11, wherein a gate electrode of the second reset transistor is connected with a second reset control line which is connected to a second reset control terminal to receive the second reset signal, a first electrode of the second reset transistor is connected with the first electrode of the light emitter element, and a second electrode of the second reset transistor is connected with a reset signal line which is connected to a reset voltage terminal to receive the second reset voltage;

the second reset control line and the reset signal line extend along the first direction and are arranged along the second direction, and an orthographic projection of the reset signal line on the base substrate is on a side of an orthographic projection of the second reset control line on the base substrate away from an orthographic projection of the storage capacitor on the base substrate.

13. The display substrate according to claim 3, wherein the driving circuit comprises a driving transistor, a gate electrode of the driving transistor serves as the control terminal of the driving circuit, a first electrode of the driving transistor serves as the first terminal of the driving circuit, and a second electrode of the driving transistor serves as the second terminal of the driving circuit;

the first reset circuit comprises a first reset transistor, a gate electrode of the first reset transistor is connected to a first reset control terminal to receive the first reset signal, a first electrode of the first reset transistor is connected to the control terminal of the driving circuit, and a second electrode of the first reset transistor is connected to a reset voltage terminal to receive the first reset voltage;

an electrode in which an active layer of the first reset transistor is located and an electrode in which an active layer of the driving transistor is located are spaced apart with each other and are not a continuous integral structure.

14. The display substrate according to claim 1, wherein the data writing circuit comprises a data writing transistor, a gate electrode of the data writing transistor is connected to the scan signal terminal to receive the scan signal, a first electrode of the data writing transistor is connected to a data signal terminal to receive the data signal, and a second electrode of the data writing transistor is connected to the first terminal of the driving circuit;

an electrode in which an active layer of the data writing transistor is located and an electrode in which an active layer of the driving circuit constitute a continuous integral structure.

15. The display substrate according to claim 1, wherein a first terminal of the data writing circuit is connected to a data signal terminal to receive the data signal, the display substrate further comprises:

a data signal line, connected to a data signal terminal to provide the data signal, wherein the data line extends along the second direction and comprises a protrusion protruding along the first direction and towards an electrode in which an active layer of the data writing transistor is located, to be connected with the electrode in which the active layer of the data writing transistor is located.

16. The display substrate according to claim 1, further comprising:

a first power supply line, connected to the first voltage terminal and is configured to provide the first voltage, wherein the first power supply line comprises a main part extending along the second direction and an inclined part extending along an inclined direction, the inclined direction has an included angel with the second direction; and a length of the main part of the first power supply line in the second direction is greater than a length of the inclined part of the first power supply line in the inclined direction.

17. The display substrate according to claim 13, wherein the first reset signal provided by the first reset control terminal is a high-level signal to turn on the first reset transistor.

18. The display substrate according to claim 4, wherein scan signal provided for the gate electrode of the compensation transistor is a high-level signal to turn on the compensation transistor.

19. A display device comprising the display substrate according to claim 1.

* * * * *